US012641970B2

(12) United States Patent
Lee et al.

(10) Patent No.: US 12,641,970 B2
(45) Date of Patent: May 26, 2026

(54) DISPLAY DEVICE AND ELECTRONIC APPARATUS INCLUDING THE SAME

(71) Applicant: Samsung Display Co., Ltd., Yongin-si (KR)

(72) Inventors: Wonse Lee, Yongin-si (KR); Donghyeon Jang, Yongin-si (KR); Yujin Jeon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 999 days.

(21) Appl. No.: 17/707,204

(22) Filed: Mar. 29, 2022

(65) Prior Publication Data

US 2023/0079023 A1     Mar. 16, 2023

(30) Foreign Application Priority Data

Sep. 16, 2021     (KR) ........................ 10-2021-0124255

(51) Int. Cl.
*H10K 59/131*          (2023.01)
*H10K 59/121*          (2023.01)

(52) U.S. Cl.
CPC ....... *H10K 59/131* (2023.02); *H10K 59/1213* (2023.02)

(58) Field of Classification Search
CPC ............. H10K 59/1201; H10K 71/861; H10K 59/131; G09G 3/006; G09G 3/3233; G09G 2330/12; G09G 2300/0842; G09G 2300/0426; G09G 2300/0413
See application file for complete search history.

(56) References Cited

U.S. PATENT DOCUMENTS

| | | | |
|---|---|---|---|
| 10,437,974 B2 | 10/2019 | He et al. | |
| 11,164,514 B2 | 11/2021 | Cho et al. | |
| 11,404,523 B2 | 8/2022 | Kang et al. | |
| 12,245,465 B2 | 3/2025 | Chung et al. | |
| 2017/0301280 A1* | 10/2017 | Ka ...................... | G09G 3/3406 |
| 2018/0342572 A1* | 11/2018 | Park .................... | H10K 59/123 |

(Continued)

FOREIGN PATENT DOCUMENTS

| | | |
|---|---|---|
| CN | 112614875 A | 4/2021 |
| KR | 10-2020-0037029 A | 4/2020 |

(Continued)

*Primary Examiner* — Shaheda A Abdin

(74) *Attorney, Agent, or Firm* — Womble Bond Dickinson (US) LLP

(57)     ABSTRACT

A display device includes first light emitting elements and first pixel circuits in a first display area and connected to each other, second pixel circuits in a third display area and connected to second light emitting elements in a second display area, a first initialization voltage supply line to provide a first initialization voltage to the first pixel circuits, a second initialization voltage supply line to provide a second initialization voltage to the second pixel circuits, and a connection line-pattern unit including horizontal connection lines extending in a row direction and vertical connection lines extending in a column direction. A first vertical connection line of the connection line-pattern unit is connected to the pad unit. A second horizontal connection line of the connection line-pattern unit is to connect the second pixel circuits to the second initialization voltage supply line.

23 Claims, 18 Drawing Sheets

(56) References Cited

U.S. PATENT DOCUMENTS

| | | | | |
|---|---|---|---|---|
| 2019/0392767 A1* | 12/2019 | Kim | .................... | H10K 59/131 |
| 2020/0380918 A1* | 12/2020 | Cho | .................... | G09G 3/3258 |
| 2021/0066430 A1* | 3/2021 | Cha | .................... | H10K 59/1216 |

FOREIGN PATENT DOCUMENTS

| | | | |
|---|---|---|---|
| KR | 10-2021-0018561 | A | 2/2021 |
| KR | 10-2021-0025160 | A | 3/2021 |
| KR | 10-2021-0041163 | A | 4/2021 |

* cited by examiner

DISPLAY DEVICE AND ELECTRONIC APPARATUS INCLUDING THE SAME

CROSS-REFERENCE TO RELATED APPLICATION

This application claims priority to and the benefit of Korean Patent Application No. 10-2021-0124255, filed on Sep. 16, 2021, in the Korean Intellectual Property Office (KIPO), the entire disclosure of which is incorporated by reference herein.

BACKGROUND

1. Field

One or more embodiments relate to a display device and an electronic apparatus including the same.

2. Description of the Related Art

In recent years, the use of a display device has diversified. In addition, a display device has become relatively thinner, and the weight thereof has become relatively lighter, and thus, the range of the use thereof is increasing.

In a display device, as the area occupied by a display area is enlarged, various functions applied or linked to the display device have been added. As a method of adding various functions while increasing an area, research into a display device having an area for adding various functions other than image display inside the display area has been conducted.

SUMMARY

Aspects of one or more embodiments of the present disclosure are directed toward a display device in which a display area is enlarged to display an image even in an area where electronic components are arranged, and an electronic apparatus including the same. In addition, aspects of one or more embodiments of the present disclosure are directed toward a display device in which display quality is improved by allowing a display area where electronic components are arranged to have equal luminance to another display area where electronic components are not arranged, and an electronic apparatus including the same. However, these aspects are examples, and the scope of the present disclosure is not limited thereto.

Additional aspects will be set forth in part in the description which follows and, in part, will be apparent from the description, or may be learned by practice of the presented embodiments of the disclosure.

According to an embodiment, a display device includes: a plurality of first light emitting elements and a plurality of first pixel circuits arranged in a first display area and electrically connected to each other, a plurality of second light emitting elements arranged in a second display area including a transmission area and at least partially surrounded by the first display area, a plurality of second pixel circuits arranged in a third display area between the first display area and the second display area and electrically connected to the plurality of second light emitting elements, a pad unit disposed in a peripheral area outside the first display area, a data line disposed in the first display area and extending in a column direction, a first initialization voltage supply line disposed in the peripheral area and configured to provide a first initialization voltage to each of the plurality of first pixel circuits, a second initialization voltage supply line disposed in the peripheral area and configured to provide a second initialization voltage having a different level from the first initialization voltage to the plurality of second pixel circuits (e.g., each of the plurality of second pixel circuits), and a connection line-pattern unit including a plurality of horizontal connection lines extending in a row direction and a plurality of vertical connection lines extending in the column direction. A first vertical connection line of the plurality of vertical connection lines of the connection line-pattern unit is electrically connected to the pad unit. A first horizontal connection line of the plurality of horizontal connection lines of the connection line-pattern unit is configured to electrically connect the first vertical connection line to the data line. A second horizontal connection line of the plurality of horizontal connection lines of the connection line-pattern unit is configured to electrically connect the plurality of second pixel circuits to the second initialization voltage supply line.

According to the present embodiment, the second horizontal connection line may be disposed in an area located at both sides of the second display area along the row direction in the first display area.

According to the present embodiment, the display device may further include a branch line disposed in the third display area and extending in the column direction. The second horizontal connection line may include a plurality of second horizontal connection lines that are arranged along the column direction and electrically connected to the branch line.

According to the present embodiment, the display device may further include a common voltage supply line disposed in the peripheral area and configured to supply a common power voltage to the plurality of first light emitting elements and the plurality of second light emitting elements. A second vertical connection line of the plurality of vertical connection lines of the connection line-pad unit may be electrically connected to the common voltage supply line.

According to the present embodiment, the display device may further include a common voltage supply line disposed in the peripheral area and configured to supply a common power voltage to the plurality of first light emitting elements and the plurality of second light emitting elements. A third horizontal connection line of the plurality of horizontal connection lines of the connection line-pad unit may be electrically connected to the common voltage supply line.

According to the present embodiment, the display device may further include a driving voltage supply line disposed in the peripheral area and configured to supply a driving power voltage to the plurality of first pixel circuits and the plurality of second pixel circuits. A second vertical connection line of the plurality of vertical connection lines of the connection line-pad unit may be electrically connected to the driving voltage supply line.

According to the present embodiment, the display device may further include a driving voltage supply line disposed in the peripheral area and configured to supply a driving power voltage to the plurality of first pixel circuits and the plurality of second pixel circuits. A third horizontal connection line of the plurality of horizontal connection lines of the connection line-pad unit may be electrically connected to the driving voltage supply line.

According to the present embodiment, the display device may further include a first anode initialization voltage supply line disposed in the peripheral area and configured to provide a first anode initialization voltage to the plurality of first pixel circuits (e.g., each of the plurality of first pixel circuits), and a second anode initialization voltage supply line disposed in the peripheral area and configured to provide a second anode initialization voltage having a different level from the first anode initialization voltage to the plurality of second pixel circuits (e.g., each of the plurality of second pixel circuits).

According to the present embodiment, the second horizontal connection line of the plurality of horizontal connection lines of the connection line-pattern unit may include a 2-1th horizontal connection line and a 2-2th horizontal connection line spaced from each other along the column direction. The 2-1th horizontal connection line may be configured to electrically connect 2-1th pixel circuits arranged in a first row from among the plurality of second pixel circuits to the second initialization voltage supply line. The 2-2th horizontal connection line may be configured to electrically connect 2-2th pixel circuits arranged in a second row different from the first row from among the plurality of second pixel circuits to the second anode initialization voltage supply line.

According to the present embodiment, the 2-1th horizontal connection line may include a plurality of 2-1th horizontal connection lines, and the 2-2th horizontal connection line may include a plurality of 2-2th horizontal connection lines. The plurality of 2-1th horizontal connection lines and the plurality of 2-2th horizontal connection lines are alternately arranged along the column direction.

According to another embodiment, a display device includes a plurality of first light emitting elements and a plurality of first pixel circuits arranged in a first display area and electrically connected to each other, a plurality of second light emitting elements arranged in a second display area including a transmission area and at least partially surrounded by the first display area, a plurality of second pixel circuits arranged in a third display area between the first display area and the second display area and electrically connected to the plurality of second light emitting elements, a pad unit disposed in a peripheral area outside the first display area, a data line disposed in the first display area and extending in a column direction, a first initialization voltage supply line disposed in the peripheral area and configured to provide a first initialization voltage to the plurality of first pixel circuits (e.g., each of the plurality of first pixel circuits), a second initialization voltage supply line in the peripheral area and configured to provide a second initialization voltage having a different level from the first initialization voltage to the plurality of second pixel circuits (e.g., each of the plurality of second pixel circuits), a first anode initialization voltage supply line disposed in the peripheral area and configured to provide a first anode initialization voltage to the plurality of first pixel circuits (e.g., each of the plurality of first pixel circuits), a second anode initialization voltage supply line in the peripheral area and configured to provide a second anode initialization voltage having a different level from the first anode initialization voltage to the plurality of second pixel circuits (e.g., each of the plurality of second pixel circuits), and a connection line-pattern unit including a plurality of horizontal connection lines extending in a row direction and a plurality of vertical connection lines extending in the column direction. A first vertical connection line of the plurality of vertical connection lines of the connection line-pattern unit is electrically connected to the pad unit. A first horizontal connection line of the plurality of horizontal connection lines of the connection line-pattern unit is configured to electrically connect the first vertical connection line to the data line. A second horizontal connection line of the plurality of horizontal connection lines of the connection line-pattern unit is configured to electrically connect the plurality of second pixel circuits to the second anode initialization voltage supply line.

According to the present embodiment, the second horizontal connection line may be disposed in a first area located at both sides of the second display area along the row direction in the first display area.

According to the present embodiment, the display device may further include a branch line disposed in the third display area and extending in the column direction. The second horizontal connection line may include a plurality of second horizontal connection lines that are arranged in the column direction and electrically connected to the branch line.

According to the present embodiment, the display device may further include a common voltage supply line disposed in the peripheral area and configured to supply a common power voltage to the plurality of first light emitting elements and the plurality of second light emitting elements. A second vertical connection line of the plurality of vertical connection lines of the connection line-pad unit may be electrically connected to the common voltage supply line.

According to the present embodiment, the display device may further include a common voltage supply line disposed in the peripheral area and configured to supply a common power voltage to the plurality of first light emitting elements and the plurality of second light emitting elements. A third horizontal connection line of the plurality of horizontal connection lines of the connection line-pad unit may be electrically connected to the common voltage supply line.

According to the present embodiment, the display device may further include a driving voltage supply line disposed in the peripheral area and configured to supply a driving power voltage to the plurality of first pixel circuits and the plurality of second pixel circuits. A second vertical connection line of the plurality of vertical connection lines of the connection line-pad unit may be electrically connected to the driving voltage supply line.

According to the present embodiment, the display device may further include a driving voltage supply line disposed in the peripheral area and configured to supply a driving power voltage to the plurality of first pixel circuits and the plurality of second pixel circuits. A third horizontal connection line of the plurality of horizontal connection lines of the connection line-pad unit may be electrically connected to the driving voltage supply line.

According to another embodiment, an electronic apparatus includes a display device including a first display area and a second display area having different resolutions from each other, and a third display area located between the first display area and the second display area, and an electronic component overlapping a transmission area in the second display area. The display device includes a plurality of first light emitting elements and a plurality of first pixel circuits arranged in the first display area and electrically connected to each other, a plurality of second light emitting elements arranged in the second display area including the transmission area and at least partially surrounded by the first display area, a plurality of second pixel circuits arranged in the third display area between the first display area and the second display area and electrically connected to the plurality of second light emitting elements, a pad unit disposed in a peripheral area outside the first display area, a data line disposed in the first display area and extending in a column direction, a first initialization voltage supply line disposed in the peripheral area and configured to provide a first initialization voltage to the plurality of first pixel circuits (e.g., each of the plurality of first pixel circuits), a second initialization voltage supply line disposed in the peripheral area and configured to provide a second initialization voltage having a different level from the first initialization voltage to the plurality of second pixel circuits (e.g., each of the plurality of second pixel circuits), and a connection line-pattern unit including a plurality of horizontal connection lines extending in a row direction and a plurality of vertical connection lines extending in the column direction. A first vertical connection line of the plurality of vertical connection lines of the connection line-pattern unit is electrically connected to the pad unit. A first horizontal connection line of the plurality of horizontal connection lines of the connection line-pattern unit is configured to electrically connect the first vertical connection line to the data line. A second horizontal connection line of the plurality of horizontal connection lines of the connection line-pattern unit is configured to electrically connect the plurality of second pixel circuits to the second initialization voltage supply line.

According to the present embodiment, the second horizontal connection line may be disposed in a first area located at both sides of the second display area along the row direction in the first display area.

According to the present embodiment, the display device further may further include a branch line disposed in the third display area and extending in the column direction. The second horizontal connection line may include a plurality of second horizontal connection lines that are arranged in the column direction and electrically connected to the branch line.

According to the present embodiment, the display device further may further include a common voltage supply line disposed in the peripheral area and configured to supply a common power voltage to the plurality of first light emitting elements and the plurality of second light emitting elements. A second vertical connection line of the plurality of vertical connection lines of the connection line-pad unit may be electrically connected to the common voltage supply line. A third horizontal connection line of the plurality of horizontal connection lines of the connection line-pad unit may be electrically connected to the common voltage supply line.

According to the present embodiment, the display device further may further include a driving voltage supply line in the peripheral area and configured to supply a driving power voltage to the plurality of first pixel circuits and the plurality of second pixel circuits. A second vertical connection line of the plurality of vertical connection lines of the connection line-pad unit may be electrically connected to the driving voltage supply line. A third horizontal connection line of the plurality of horizontal connection lines of the connection line-pad unit may be electrically connected to the driving voltage supply line.

According to the present embodiment, the display device further may further include a first anode initialization voltage supply line in the peripheral area and configured to provide a first anode initialization voltage to the plurality of first pixel circuits (e.g., each of the plurality of first pixel circuits), and a second anode initialization voltage supply line disposed in the peripheral area and configured to provide a second anode initialization voltage having a different level from the first anode initialization voltage to the plurality of second pixel circuits (e.g., each of the plurality of second pixel circuits). The second horizontal connection line of the plurality of horizontal connection lines of the connection line-pattern unit may include a 2-1th horizontal connection line and a 2-2th horizontal connection line spaced from each other along the column direction. The 2-1th horizontal connection line may be configured to electrically connect 2-1th pixel circuits arranged in a first row from among the plurality of second pixel circuits to the second initialization voltage supply line. The 2-2th horizontal connection line may be configured to electrically connect 2-2th pixel circuits arranged in a second row different from the first row from among the plurality of second pixel circuits to the second anode initialization voltage supply line.

Other aspects, features, and advantages other than those described above will become apparent from the following detailed description for carrying out the present disclosure, claims, and drawings, These general and specific embodiments may be carried out using systems, methods, computer programs, or any combination of systems, methods, and computer programs.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
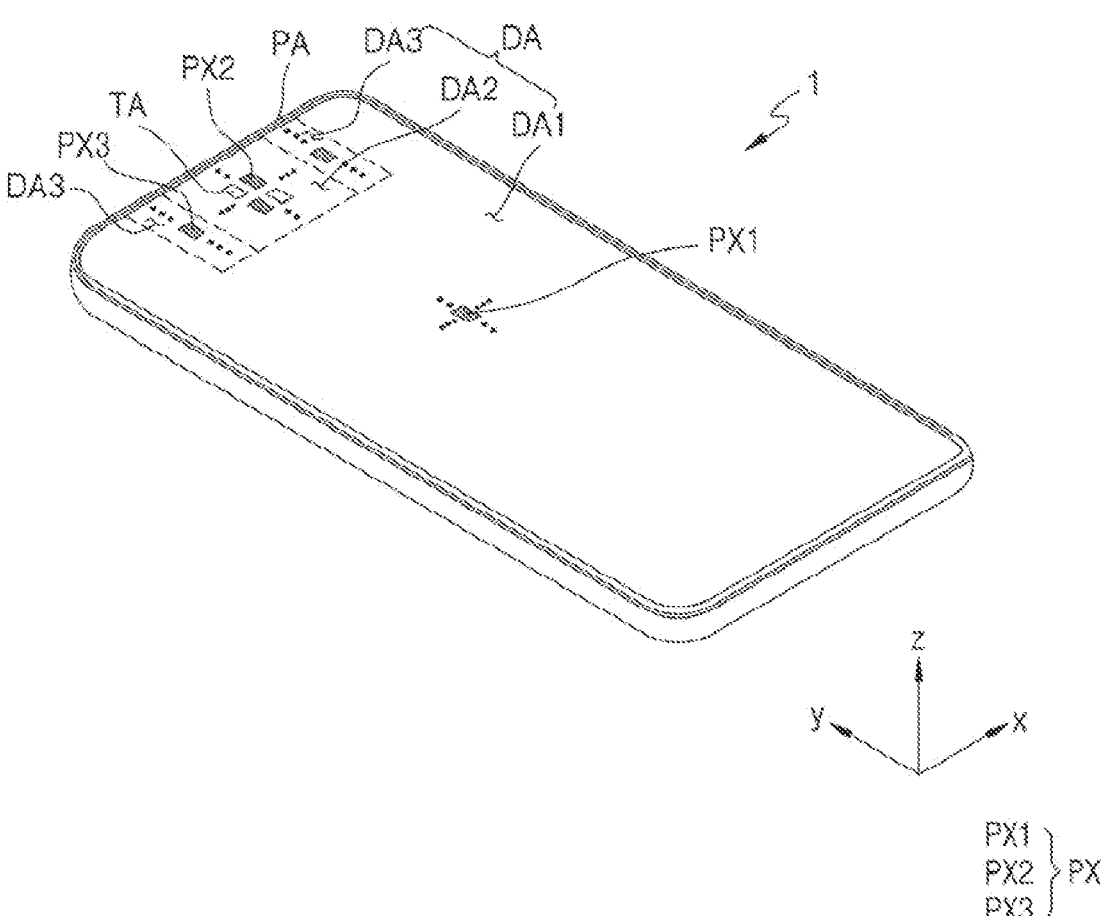
FIG. 1 is a perspective view schematically illustrating an electronic apparatus according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the drawings, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Because the present disclosure can apply one or more suitable modifications and can have various embodiments, specific embodiments are illustrated in the drawings and described in more detail in the detailed description. Effects and features of the present disclosure, and methods of achieving them, will become apparent with reference to the embodiments described below in more detail in conjunction with the drawings. However, the present disclosure is not limited to the embodiments disclosed below, and may be implemented in one or more suitable forms.

Hereinafter, embodiments of the present disclosure will be described in more detail with reference to the accompanying drawings. When describing the present disclosure with reference to the drawings, the same or corresponding components are given the same reference numerals, and duplicative descriptions thereof may not be provided.

The terminology used herein is for the purpose of describing particular embodiments only and is not intended to limit the embodiments described herein.

Although the terms first, second, etc. may be used to describe various elements, these elements should not be limited by these terms. These terms are only used to distinguish one element from another element. For example, a first element may be referred to as a second element, and similarly, a second element may also be referred to as a first element without departing from the scope of the present disclosure.

In the following embodiments, the singular forms "a," "an," and "the" are intended to include the plural forms as well, unless the context clearly indicates otherwise.

It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

In the following embodiments, when various components such as layers, films, regions, plates, etc. are "on" other components, this includes not only a case where they are "on" other components, but also a case where another component is interposed therebetween.

For convenience of description, in the drawings, the sizes of components may be exaggerated or reduced. For example, because the size and thickness of each component shown in the drawings are arbitrarily indicated for convenience of description, the present disclosure is not necessarily limited to descriptions with reference to the drawings.

In the case where a certain embodiment is otherwise practicable, a specific process sequence may be performed different from the described sequence. For example, two processes described in succession may be performed substantially concurrently (e.g., simultaneously), or may be performed in an order opposite to the order described.

As used herein, "A and/or B" refers to A, B, or A and B. In addition, "at least one of A and B" refers to A, B, or A and B.

In the following embodiments, the case where films, regions, components are connected includes a case where films, regions, components are directly connected and/or a case where films, regions, components are indirectly connected by interposing another film, another region and another component between films, regions, components. For example, as used herein, the case where films, regions, components are electrically connected includes a case where films, regions, components are directly electrically connected and/or a case where films, regions, components are indirectly electrically connected by interposing another film, another region and another component between films, regions, components.

In the following embodiments, the x-axis, y-axis, and z-axis are not limited to three axes on a Cartesian coordinate system, and may be interpreted in a broad sense including them. For example, the x-axis, y-axis, and z-axis may be orthogonal to each other, but may indicate different directions that are not orthogonal to each other.

Further, the use of "may" when describing embodiments of the present disclosure refers to "one or more embodiments of the present disclosure."

In the drawings, the relative sizes of elements, layers, and regions may be exaggerated and/or simplified for clarity. Spatially relative terms, such as "beneath," "below," "lower," "above," "upper," "bottom," "top," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially," "about," and similar terms are used as terms of approximation and not as terms of degree, and are intended to account for the inherent deviations in measured or calculated values that would be recognized by those of ordinary skill in the art.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view schematically illustrating an electronic apparatus according to an embodiment.

Referring to FIG. 1, an electronic apparatus 1 may include a display area DA and a peripheral area PA outside (e.g., around) the display area DA. The display area DA may include a first display area DA1, a second display area DA2 adjacent to the first display area DA1, and a third display area DA3 between the first display area DA1 and the second display area DA2. The first display area DA1 may be around (e.g., surround) at least a part of the second display area DA2. The third display area DA3 may be adjacent to the second display area DA2, and may be disposed at at least one side of the second display area DA2.

The electronic apparatus 1 may provide an image through an array of a plurality of pixels PX that are two-dimensionally arranged in the display area DA. For example, the electronic apparatus 1 may provide a first image using light emitted from a plurality of first pixels PX1 arranged in the first display area DA1, and may provide a second image using light emitted from a plurality of second pixels PX2 arranged in the second display area DA2. Further, in one or more embodiments, the electronic apparatus 1 may provide a third image using light emitted from a plurality of third pixels PX3 arranged in the third display area DA3. In one or more embodiments, each of the first to third images may be a part of an image (e.g., a single image) provided through the display area DA of the electronic apparatus 1. In one or more embodiments, the first to third images may be provided as independent images.

In an embodiment, FIG. 1 illustrates that one second display area DA2 is provided. In another embodiment, the electronic apparatus 1 may have two or more second display areas DA2, and the shapes and sizes of the plurality of second display areas DA2 may be different from each other. When viewed from a direction substantially perpendicular to the upper surface of the electronic apparatus 1 (e.g., when viewed in a plan view), the shape of the second display area DA2 may be a polygon such as a quadrangle. In one or more embodiments, the second display area DA2 may have one or more suitable shapes, such as a circular shape, an oval shape, a star shape, and a diamond shape. In an embodiment, a ratio of the second display area DA2 to the display area DA may be less than a ratio of the first display area DA1 to the display area DA. For example, the second display area DA2 may be smaller than the first display area DA1.

Although FIG. 1 shows that the second display area DA2 is disposed at the center of the upper side (+y direction) of the first display area DA1 having a substantially rectangular shape when viewed from a direction substantially perpendicular to the upper surface of the electronic apparatus 1 (e.g., when viewed in a plan view), the second display area DA2 may be disposed, for example, at the upper right side or upper left side of the rectangular first display area DA1. In one or more embodiments, as shown in FIG. 1, the second display area DA2 may be disposed at one side of the first display area DA1 to be partially surrounded by the first display area DA1. For example, the second display area DA2 may be located at one corner of the first display area DA1 to be partially surrounded by the first display area DA1. As another example, the second display area DA2 may be disposed at the inner side of the first display area DA1 to be entirely surrounded by the first display area DA1.

An electronic component 20 (e.g., see FIG. 2) may be disposed in the second display area DA2. The electronic component 20 may be disposed under a display device 10 (e.g., see FIG. 2) to correspond to the second display area DA2. In order for the electronic component 20 to function easily, the second display area DA2 may include a transmission area TA through which light and/or sound output from the electronic component 20 or travelling from the outside toward the electronic component 20 may pass.

The transmission area TA, which is an area through which light passes, may be an area in which a pixel PX is not disposed. In the case of the electronic apparatus 1 according to an embodiment, when light is transmitted through the second display area DA2 including the transmission area TA, light transmittance may be about 10% or more, more preferably about 25% or more, about 40% or more, about 50% or more, about 85% or more, or about 90% or more.

The first display area DA1 and the second display area DA2 may have different resolutions from each other. Because the second display area DA2 includes the transmission area TA, an array of the plurality of first pixels PX1 arranged in the first display area DA1 may be different from an array of the plurality of second pixels PX2 arranged in the second display area DA2. For example, the transmission area TA may be disposed between adjacent second pixels PX2 among the plurality of second pixels PX2. In this case, the second display area DA2 may have a lower resolution than the first display area DA1. For example, because the second display area DA2 includes the transmission area TA, the number of second pixels PX2 arranged per the same area in the second display area DA2 may be less than the number of first pixels PX1 arranged per the same area in the first display area DA1. For example, the resolution of the second display area DA2 may be about ½, about ⅜, about ⅓, about ¼, about ⅔, about ⅛, about ⅑, or about 1/16 of the resolution of the first display area DA1. For example, the resolution of the first display area DA1 may be about 400 ppi or more, and the resolution of the second display area DA2 may be about 200 ppi or about 100 ppi.

The third display area DA3 may have an equal resolution to or a different resolution from the first display area DA1. For example, the third display area DA3 may have an equal resolution to or a lower resolution than the first display area DA1. For example, the third display area DA3 may have an equal resolution to the second display area DA2. In one or more embodiments, as another example, the third display area DA3 may have a higher resolution than the second display area DA2.

The peripheral area PA is a non-display area that does not provide an image, and may entirely or partially surround the display area DA. For example, the peripheral area PA may entirely or partially surround the first display area DA1, the second display area DA2, and/or the third display area DA3. Wiring, drivers, etc. for providing an electrical signal or power to the display area DA may be disposed in the peripheral area PA. Also, a pad unit to which an electronic device, a printed circuit board, and/or the like may be connected (e.g., electrically connected) may be disposed in the peripheral area PA.

For convenience of explanation, a case in which the electronic apparatus 1 is used in a smartphone is described, but the electronic apparatus 1 of the present disclosure is not limited thereto. The electronic apparatus 1 may be applied to one or more suitable products such as televisions, notebook computers, monitors, billboards, and internet of things (IoTs) as well as portable electronic appliances such as mobile phones, smartphones, tablet personal computers, mobile communication terminals, electronic notebooks, e-books, portable multimedia players (PMPs), navigators, and ultra-mobile PCs (UMPCs). In one or more embodiments, the electronic apparatus 1 according to an embodiment may be applied to wearable appliances such as smart watches, watch phones, glass displays, and head mounted displays (HMDs). In one or more embodiments, the electronic apparatus 1 according to an embodiment may be applied to car dashboards, center information displays (CIDs) disposed on a car dashboard or car center fascia, room mirror displays replacing car room mirrors, and display screens disposed on the back surface of a front seat as entertainment for a rear seat of a car.

Hereinafter, although it is described that the electronic apparatus 1 includes an organic light emitting diode (OLED) as a light emitting device, the electronic apparatus 1 of the present disclosure is not limited thereto. In another embodiment, the electronic apparatus 1 may be a light emitting display including an inorganic light emitting diode, that is, an inorganic light emitting display. In another embodiment, the electronic apparatus 1 may be a quantum dot light emitting display.

Figure 2:
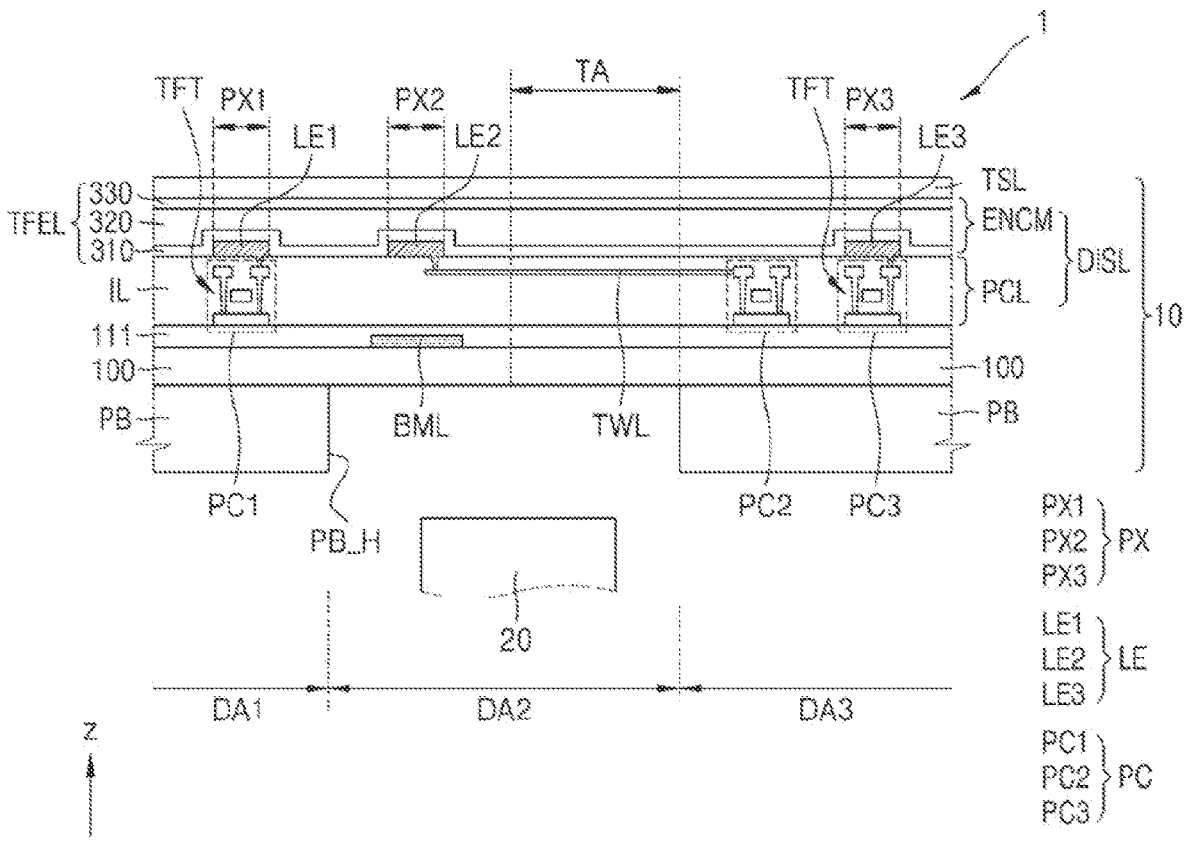
FIG. 2 is a cross-sectional view schematically illustrating a part of the electronic apparatus according to an embodiment.

FIG. 2 is a cross-sectional view schematically illustrating a part of the electronic apparatus according to an embodiment.

Referring to FIG. 2, the electronic apparatus 1 may include a display device 10 and an electronic component 20 disposed to overlap the display device 10. A cover window for protecting the display device 10 may be further disposed on the display device 10.

The display device 10 may include a first display area DA1 in which a first image is provided, and a second display area DA2 in which a second image is provided and which overlaps the electronic component 20. The display device 10 may include a third display area DA3 in which a third image is provided. The display device 10 may include a substrate 100, a display layer DISL on the substrate 100, a touch screen layer TSL, and a panel protection member PB disposed under the substrate 100.

The display layer DISL may include a pixel circuit layer PCL including a pixel circuit PC, a light emitting device layer including light emitting elements LE, and an encapsulation member ENCM. For example, the encapsulation member ENCM may be a thin film encapsulation layer TFEL. A buffer layer 111 may be disposed between the substrate 100 and the display layer DISL, and an insulating layer IL may be disposed within the display layer DISL.

The substrate 100 may be made of an insulating material such as glass, quartz, or polymer resin. The substrate 100 may be a rigid substrate or a flexible substrate capable of bending, folding, rolling, and/or the like.

A plurality of first pixel circuits PC1 and a plurality of first light emitting elements LE1 connected (e.g., electrically connected) to the plurality of first pixel circuits PC1, respectively, may be arranged in the first display area DA1 of the display device 10. The first pixel circuit PC1 includes at least one thin film transistor TFT, and may control the light emission of the first light emitting element LE1. The first light emitting element LE1 emits light through a light emitting region, and the light emitting region may be defined as the first pixel PX1. For example, the first pixel PX1 may be implemented by the light emission of the first light emitting element LE1. In one or more embodiments, the first pixel PX1 may be a sub-pixel.

A plurality of second light emitting elements LE2 may be arranged in the second display area DA2 of the display device 10. According to one or more embodiments, the second pixel circuit PC2 controlling the light emission of the second light emitting element LE2 may be disposed in an area other than the second display area DA2. For example, the second pixel circuit PC2 may be disposed in the third display area DA3 adjacent to the second display area DA2.

In this case, the second pixel circuit PC2 that controls the light emission of the second light emitting element LE2 may be disposed outside the second display area DA2.

The second pixel circuit PC2 includes at least one thin film transistor TFT, and may be connected (e.g., electrically connected) to the second light emitting element LE2 by a transparent conductive line TWL. The second pixel circuit PC2 may control the light emission of the second light emitting element LE2. The second light emitting element LE2 emits light through a light emitting region, and the light emitting region may be defined as the second pixel PX2. For example, the second pixel PX2 may be implemented by the light emission of the second light emitting element LE2. In one or more embodiments, the second pixel PX2 may be a sub-pixel.

In the second display area DA2, an area in which the second light emitting element LE2 is not disposed may include a transmission area TA. The transmission area TA may be an area through which light and/or signals emitted from the electronic component 20 and light and/or signals incident on the electronic component 20 are transmitted. The electronic component 20 may be disposed to correspond to the second display area DA2.

The transparent conductive line TWL for connecting (e.g., electrically connecting) the second pixel circuit PC2 to the second light emitting element LE2 may cross or be in the transmission area TA. For example, the transparent conductive line TWL may be made of a transparent conductive material. Because the transparent conductive line TWL has high transmittance, a decrease in transmittance of the transmission area TA may be prevented or reduced even when the transparent conductive line TWL is disposed in the transmission area TA. Further, in an embodiment, because the second pixel circuit PC2 is not disposed in the second display area DA2, the area of the transmission area TA may be sufficiently secured, and thus, the light transmittance of the second display area DA2 may be improved.

A plurality of third pixel circuits PC3 and a plurality of third light emitting elements LE3 connected (e.g., electrically connected) to the plurality of third pixel circuits PC3, respectively, may be arranged in the third display area DA3. The third pixel circuit PC3 includes at least one thin film transistor TFT, and may control the light emission of the third light emitting element LE3. In one or more embodiments, the third pixel circuit PC3 may have the same structure as the second pixel circuit PC2. The third light emitting element LE3 emits light through a light emitting region, and the light emitting region may be defined as the third pixel PX3. For example, the third pixel PX3 may be implemented by the light emission of the third light emitting element LE3. In one or more embodiments, the third pixel PX3 may be a sub-pixel.

The light emitting element LE may be covered with a thin film encapsulation layer TFEL. In one or more embodiments, as shown in FIG. 2, the thin film encapsulation layer TFEL may include at least one inorganic encapsulation layer and at least one organic encapsulation layer. In an embodiment, the thin film encapsulation layer TFEL may include a first inorganic encapsulation layer 310, a second inorganic encapsulation layer 330, and an organic encapsulation layer 320 therebetween.

The touch screen layer TSL may be configured to acquire coordinate information according to an external input, for example, a touch event. The touch screen layer TSL may include a touch electrode and touch wirings connected to the touch electrode. The touch screen layer TSL may be configured to sense an external input using a self-capacitance method or a mutual capacitance method.

The touch screen layer TSL may be formed on the thin film encapsulation layer TFEL. In one or more embodiments, the touch screen layer TSL may be separately formed on a touch substrate and then coupled to the thin film encapsulation layer TFEL through an adhesive layer such as an optically clear adhesive (OCA). In an embodiment, the touch screen layer TSL may be directly formed on the thin film encapsulation layer TFEL, and in this case, the adhesive layer may not be provided between the touch screen layer TSL and the thin film encapsulation layer TFEL.

The panel protection member PB may be attached to the lower portion of the substrate 100 to support and protect the substrate 100. The panel protection member PB may include a hole PB_H corresponding to the second display area DA2. Because the panel protection member PB has the hole PB_H, the light transmittance of the second display area DA2 may be improved. The panel protection member PB may be made of polyethylene terephthalate (PET) or polyimide (PI).

An area of the second display area DA2 may be larger than an area in which the electronic component 20 is disposed. Accordingly, the area of the hole PB_H provided in the panel protection member PB may not match the area of the second display area DA2.

The electronic component 20 may be disposed in the second display area DA2. The electronic component 20 may be an electronic element using light or sound. For example, the electronic element may be a sensor for measuring a distance such as a proximity sensor, a sensor for recognizing a part of the user's body (e.g., a fingerprint, an iris, a face, etc.), a small lamp or light source for outputting light, an image sensor for capturing an image (e.g., a camera), and/or the like. The electronic element using light may use light of one or more suitable wavelength bands, such as visible light, infrared light, and ultraviolet light. The electronic element using sound may use ultrasonic waves or sounds of other frequency bands. In one or more embodiments, a plurality of electronic components 20 may be arranged in the second display area DA2. In this case, the plurality of electronic components 20 may have different functions from each other. However, the present disclosure is not limited thereto.

In one or more embodiments, a bottom metal layer BML may be disposed in the second display area DA2. The bottom metal layer BML may be disposed between the substrate 100 and the second light emitting element LE2, and may overlap (e.g., overlap in a thickness direction of the substrate 100) the second light emitting element LE2. The bottom metal layer BML may include a light blocking material, and may block or substantially block external light from reaching the second light emitting element LE2.

Figure 3:
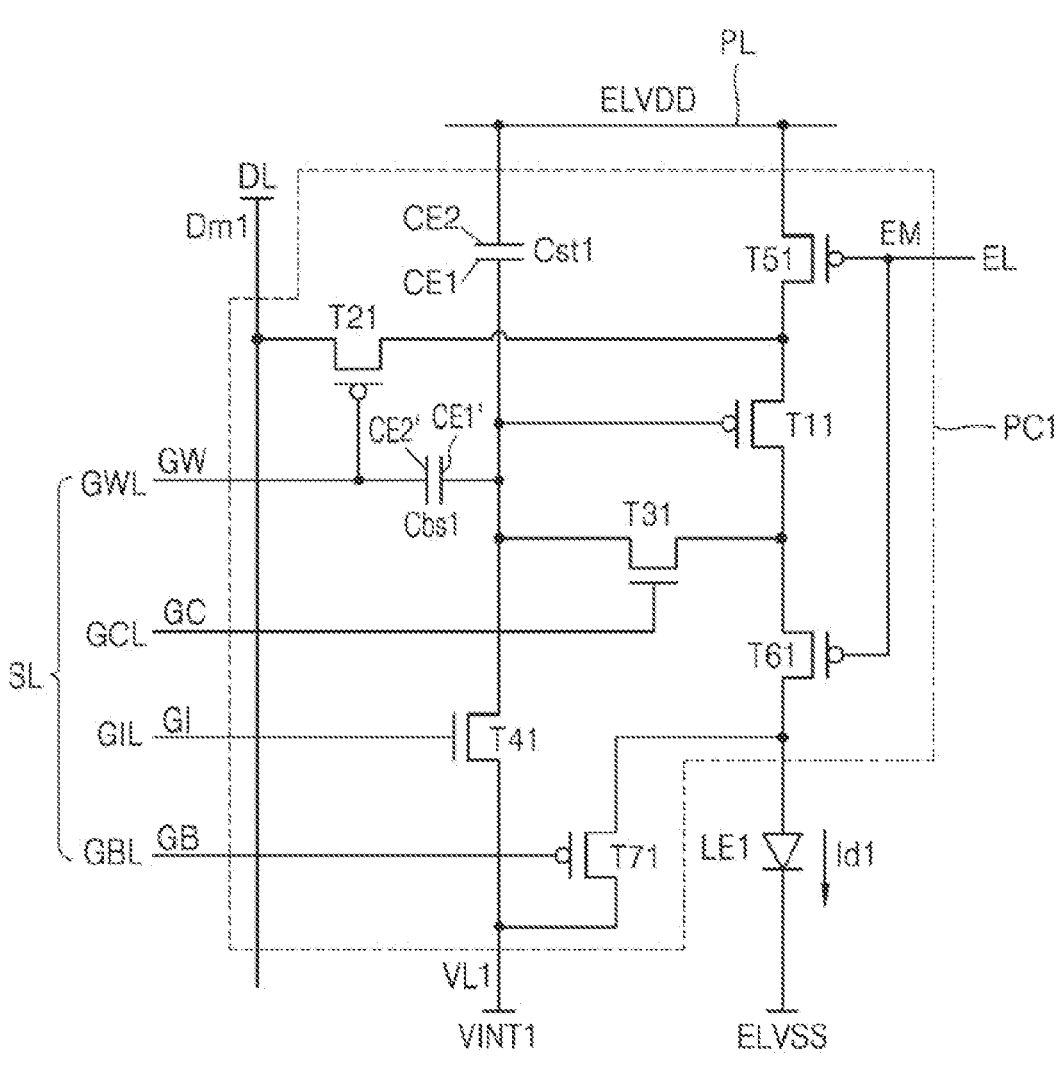
FIG. 3 is an equivalent circuit diagram of a first pixel circuit provided in the electronic apparatus according to an embodiment.

FIG. 3 is an equivalent circuit diagram of a first pixel circuit provided in the electronic apparatus according to an embodiment.

Referring to FIG. 3, the first pixel circuit PC1 may be connected (e.g., electrically connected) to a scan line SL for transmitting a scan signal. For example, the first pixel circuit PC1 may be connected to first to fourth scan lines GWL, GCL, GIL, and GBL for respectively transmitting first to fourth scan signals GW, GC, GI, and GB. In one or more embodiments, the first pixel circuit PC1 may be connected to a data line DL for transmitting a first data signal Dm1 and an emission control line EL for transmitting an emission control signal EM. The first pixel circuit PC1 may be connected to a driving voltage line PL for transmitting a driving power voltage ELVDD and a first initialization voltage line VL1 for transmitting a first initialization voltage VINT1. The first pixel circuit PC1 may be connected (e.g., electrically connected) to the first light emitting element LE1. The first light emitting element LE1 may be an organic light emitting diode OLED, and may include a pixel electrode as an anode and a counter electrode as a cathode. A common power voltage ELVSS may be applied to the counter electrode of the first light emitting element LE1.

The first pixel circuit PC1 may include first to seventh transistors T11 to T71, a first storage capacitor Cst1, and a first boosting capacitor Cbs1.

Some of the first to seventh transistors T11 to T71 may be provided as n-channel MOSFETs (NMOSs), and the others thereof may be provided as p-channel MOSFETs (PMOSs). For example, among the first to seventh transistors T11 to T71, the third transistor T31 and the fourth transistor T41 may be provided as NMOSs, and others (e.g., the first transistor T11, the second transistor T21, the fifth transistor T51, the sixth transistor T61, and the seventh transistor T71) may be provided as PMOSs.

In another embodiment, among the first to seventh transistors T11 to T71, the third transistor T31, the fourth transistor T41, and the seventh transistor T71 may be provided as NMOSs, and others may be provided as PMOSs. In one or more embodiments, among the first to seventh transistors T11 to T71, only one may be provided as an NMOS, and the others may be provided as PMOSs. In one or more embodiments, all of the first to seventh transistors T11 to T71 may be provided as NMOSs or PMOSs.

The first transistor T11 may be a driving transistor in which the intensity of a drain current is determined according to a gate-source voltage, and the second to seventh transistors T21 to T71 may be switching transistors that are turned on/off according to a gate-source voltage, substantially a gate voltage.

The first transistor T11 is referred to as a first driving transistor, the second transistor T21 is referred to as a first scan transistor, the third transistor T31 is referred to as a first compensation transistor, the fourth transistor T41 is referred to as a first gate initialization transistor, the fifth transistor T51 is referred to as a first operation control transistor, the sixth transistor T61 is referred to as a first emission control transistor, and the seventh transistor T71 is referred to as a first anode initialization transistor.

The first storage capacitor Cst1 is connected between a driving voltage line PL and a gate of the first driving transistor T11. The first storage capacitor Cst1 may have a second electrode CE2 connected to the driving voltage line PL and a first electrode CE1 connected to the gate of the first driving transistor T11.

The first driving transistor T11 may control the intensity of a first current Id1 flowing from the driving voltage line PL to the first light emitting element LE1 according to the gate-source voltage. The first driving transistor T11 may have the gate connected to the first electrode CE1 of the first storage capacitor Cst1, a source connected to the driving voltage line PL through the first operation control transistor T51, and a drain connected to the first light emitting element LE1 through the first emission control transistor T61.

The first driving transistor T11 may be configured to output the first current Id1 to the first light emitting element LE1 according to the gate-source voltage. The intensity of the first current Id1 is determined based on a difference between the gate-source voltage and threshold voltage of the first driving transistor T11. The first light emitting device LE1 may receive the first current Id1 from the first driving transistor T11 and emit light with luminance according to the intensity of the first current Id1.

The first scan transistor T21 is configured to transmit the first data signal Dm1 to the source of the first driving transistor T11 in response to the first scan signal GW. The first scan transistor T21 may have a gate connected to the first scan line GWL, a source connected to the data line DL, and a drain connected to the source of the first driving transistor T11.

The first compensation transistor T31 is configured to connect the drain and gate of the first driving transistor T11 to each other in response to the second scan signal GC. The first compensation transistor T31 may have a gate connected to the second scan line GCL, a source connected to the gate of the first driving transistor T11, and a drain connected to the drain of the first driving transistor T11.

The first gate initialization transistor T41 is configured to apply the first initialization voltage VINT1 to the gate of the first driving transistor T11 in response to the third scan signal GI. The first gate initialization transistor T41 may have a gate connected to the third scan line GIL, a source connected to the first initialization voltage line VL1, and a drain connected to the gate of the first driving transistor T11.

The first anode initialization transistor T71 is configured to apply the first initialization voltage VINT1 to the pixel electrode of the first light emitting element LE1 in response to the fourth scan signal GB. The first anode initialization transistor T71 may have a gate connected to the fourth scan line GBL, a source connected to the pixel electrode of the first light emitting element LE1, and a drain connected to the first initialization voltage line VL1.

Although it is shown in FIG. 3 that the first gate initialization transistor T41 and the first anode initialization transistor T71 are connected to the first initialization voltage line VL1, in another embodiment, the first gate initialization transistor T41 and the first anode initialization transistor T71 may be respectively connected to different voltage lines from each other. This will be described later with reference to FIG. 15.

The first operation control transistor T51 may be configured to connect the driving voltage line PL and the source of the first driving transistor T11 to each other in response to the emission control signal EM. The first operation control transistor T51 may have a gate connected to the emission control line EL, a source connected to the driving voltage line PL, and a drain connected to the source of the first driving transistor T11.

The first emission control transistor T61 may be configured to connect the drain of the first driving transistor T11 and the pixel electrode of the first light emitting element LE1 to each other in response to the emission control signal EM. The first emission control transistor T61 may have a gate connected to the emission control line EL, a source connected to the drain of the first driving transistor T11, and a drain connected to the pixel electrode of the first light emitting element LE1.

The first scan signal GW and the second scan signal GC may be substantially synchronized. The third scan signal GI may be substantially synchronized with the first scan signal GW of the previous row. The fourth scan signal GB may be substantially synchronized with the first scan signal GW. According to another embodiment, the fourth scan signal GB may be substantially synchronized with the first scan signal GW of the next row.

The first boosting capacitor Cbs1 may have a first electrode CE1' connected to the first electrode CE1 of the first storage capacitor, and a second electrode CE2' connected to the gate of the first scan transistor T21. The second electrode CE2' of the first boosting capacitor Cbs1 may receive the first scan signal GW. The first boosting capacitor Cbs1 may be configured to increase the voltage of a gate terminal of the first driving transistor T11 when the supply of the first scan signal GW is stopped, thereby compensating for a voltage drop of the gate terminal of the first driving transistor T11.

Hereinafter, detailed operation processes of the first pixel circuit PC1 and the first light emitting element LE1 according to an embodiment are described in more detail.

First, when a high-level emission control signal EM is received, the first operation control transistor T51 and the first light emission control transistor T61 are turned off, the first driving transistor T11 stops the output of the first current Id1, and the first light emitting element LE1 stops light emission.

Thereafter, during a gate initialization period in which a high-level third scan signal GI is received, the first gate initialization transistor T41 is turned on, and the first initialization voltage VINT1 is applied to the gate of the first driving transistor T11, that is, to the first electrode CE1 of the first storage capacitor Cst1. A difference ELVDD−VINT1 between the driving power voltage ELVDD and the first initialization voltage VINT1 is stored in the first storage capacitor Cst1.

Thereafter, during a data writing period in which a low-level first scan signal GW and a high-level second scan signal GC are received, the first scan transistor T21 and the first compensation transistor T31 are turned on, and the first data signal Dm1 is provided to the source of the first driving transistor T11. The first driving transistor T11 is diode-connected by the first compensation transistor T31, and is forward-biased. The gate voltage of the first driving transistor T11 increases from the first initialization voltage VINT1. When the gate voltage of the first driving transistor T11 becomes equal to the data compensation voltage Dm1−|Vth|, which is decreased by the threshold voltage Vth of the first driving transistor T11 from the first data signal Dm1, the first driving transistor T11 is turned off, and thus an increase of the gate voltage of the first driving transistor T11 is stopped. Accordingly, a difference (ELVDD−Dm1+|Vth|) between the driving power voltage ELVDD and the data compensation voltage Dm1−|Vth| is stored in the first storage capacitor Cst1.

In one or more embodiments, during an anode initialization period in which a low-level fourth scan signal GB is received, the first anode initialization transistor T71 is turned on, and the first initialization voltage VINT1 is applied to the pixel electrode of the first light emitting element LE1. As the first initialization voltage VINT1 is applied to the pixel electrode of the first light emitting element LE1 to completely stop the light emission of the first light emitting element LE1, a phenomenon in which the first light emitting element LE1 emits fine light in response to the black gradation in the next frame may be eliminated.

The first scan signal GW and the fourth scan signal GB may be substantially synchronized with each other. In this case, the data writing period and the anode initialization period may be the same period.

Thereafter, when a low-level emission control signal EM is received, the first operation control transistor T51 and the first emission control transistor T61 are turned on, the first driving transistor T11 outputs the first current Id1 corresponding to the voltage stored in the first storage capacitor Cst1, that is, a voltage ELVDD−Dm1 obtained by subtracting the threshold voltage |Vth| of the first driving transistor T11 from the source-gate voltage ELVDD−Dm1+|Vth| of the first driving transistor T11, and the first light emitting element LE1 emits light with a luminance corresponding to the intensity of the first current Id1.

In the present embodiment, at least one of the first to seventh transistors T11 to T71 includes a semiconductor layer containing an oxide, and the others include a semiconductor layer containing silicon.

For example, the first driving transistor T11, which directly affects the brightness of a display device, may be configured to include a semiconductor layer made of polycrystalline silicon having high reliability, thereby realizing a high-resolution display device.

Because an oxide semiconductor has high carrier mobility and low leakage current, a voltage drop is not large even if driving time is long. For example, because the color change of an image according to a voltage drop is not large even during low-frequency driving, low-frequency driving is possible.

As such, because the oxide semiconductor has an advantage of low leak current, when at least one of the first compensation transistor T31, first gate initialization transistor T41 and first anode initialization transistor T71 connected to the gate of the first driving transistor T11 employs an oxide semiconductor, a leakage current that may flow to the gate of the first driving transistor T11 may be prevented or substantially prevented, and power consumption may be reduced.

Figure 4:
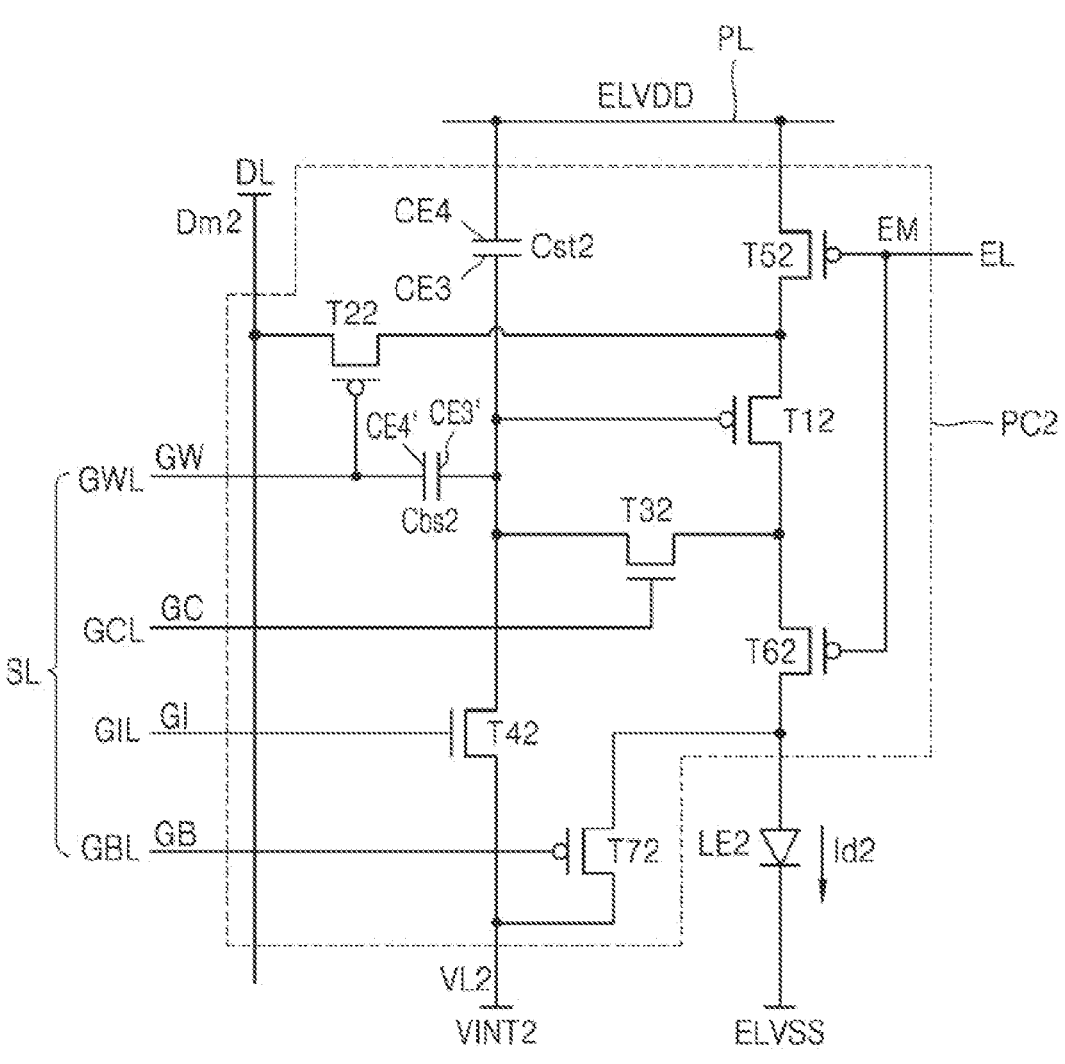
FIG. 4 is an equivalent circuit diagram of a second pixel circuit provided in the electronic apparatus according to an embodiment.

FIG. 4 is an equivalent circuit diagram of a second pixel circuit provided in the electronic apparatus according to an embodiment.

Referring to FIG. 4, a second pixel circuit PC2 may be connected (e.g., electrically connected) to a scan line SL for transmitting a scan signal. For example, the second pixel circuit PC2 may be connected to first to fourth scan lines GWL, GCL, GIL, and GBL for respectively transmitting first to fourth scan signals GW, GC, GI, and GB. Also, the second pixel circuit PC2 may be connected to a data line DL for transmitting a second data signal Dm2 and an emission control line EL for transmitting an emission control signal EM. The second pixel circuit PC2 may be connected to a driving voltage line PL for transmitting a driving power voltage ELVDD and a second initialization voltage line VL2 for transmitting a second initialization voltage VINT2. The second pixel circuit PC2 may be connected (e.g., electrically connected) to the second light emitting element LE2. The second light emitting element LE2 may be an organic light emitting diode OLED, and may include a pixel electrode as an anode and a counter electrode as a cathode. A common power voltage ELVSS may be applied to the counter electrode of the second light emitting element LE2.

The second pixel circuit PC2 may include first to seventh transistors T12 to T72, a second storage capacitor Cst2, and a second boosting capacitor Cbs2.

The first transistor T12 may be a driving transistor in which the intensity of a drain current is determined according to a gate-source voltage, and the second to seventh transistors T22 to T72 may be switching transistors that are turned on/off according to a gate-source voltage, substantially a gate voltage.

The first transistor T12 is referred to as a second driving transistor, the second transistor T22 is referred to as a second scan transistor, the third transistor T32 is referred to as a second compensation transistor, the fourth transistor T42 is referred to as a second gate initialization transistor, the fifth transistor T52 is referred to as a second operation control transistor, the sixth transistor T62 is referred to as a second emission control transistor, and the seventh transistor T72 is referred to as a second anode initialization transistor.

The second storage capacitor Cst2 may have a fourth electrode CE4 connected to the driving voltage line PL and a third electrode CE3 connected to the gate of the second driving transistor T12.

The second boosting capacitor Cbs2 may have a third electrode CE3' connected to the third electrode CE3 of the second storage capacitor Cst2, and a fourth electrode CE4' connected to the gate of the second scan transistor T22.

The second driving transistor T12 may be configured to output the second current Id2 to the second light emitting element LE2 according to the gate-source voltage. The intensity of the second current Id2 is determined based on a difference between the gate-source voltage and threshold voltage of the second driving transistor T12. The second light emitting device LE2 may receive the second current Id2 from the second driving transistor T12 and emit light with luminance according to the intensity of the second current Id2.

The second gate initialization transistor T42 is configured to apply the second initialization voltage VINT2 to the gate of the second driving transistor T12 in response to the third scan signal GI. The second gate initialization transistor T42 may have a gate connected to the third scan line GIL, a source connected to the second initialization voltage line VL2, and a drain connected to the gate of the second driving transistor T12.

The second anode initialization transistor T72 is configured to apply the second initialization voltage VINT2 to the pixel electrode of the second light emitting element LE2 in response to the fourth scan signal GB. The second anode initialization transistor T72 may have a gate connected to the fourth scan line GBL, a source connected to the pixel electrode of the second light emitting element LE2, and a drain connected to the second initialization voltage line VL2.

Although it is shown in FIG. 4 that the second gate initialization transistor T42 and the second anode initialization transistor T72 are connected to the second initialization voltage line VL2, in another embodiment, the second gate initialization transistor T42 and the second anode initialization transistor T72 may be respectively connected to different voltage lines from each other. This will be described later with reference to FIG. 16.

Comparing the second pixel circuit PC2 with the first pixel circuit PC1 described above with reference to FIG. 3, the same process may be applied except that the second pixel circuit PC2 is connected (e.g., electrically connected) to the second initialization voltage line VL2 instead of the first initialization voltage line VL1.

The second driving transistor T12, the second scan transistor T22, the second compensation transistor T32, the second gate initialization transistor T42, the second operation control transistor T52, the second emission control transistor T62 and the second anode initialization transistor T72 of FIG. 4 may correspond to the first driving transistor T11, the first scan transistor T21, the first compensation transistor T31, the first gate initialization transistor T41, the first operation control transistor T51, the first emission control transistor T61 and the first anode initialization transistor T71 of FIG. 3, respectively. In one or more embodiments, the second storage capacitor Cst2 and the second boosting capacitor Cbs2 of FIG. 4 may correspond to the first storage capacitor Cst1 and the first boosting capacitor Cbs1 of FIG. 3, respectively.

Figure 5:
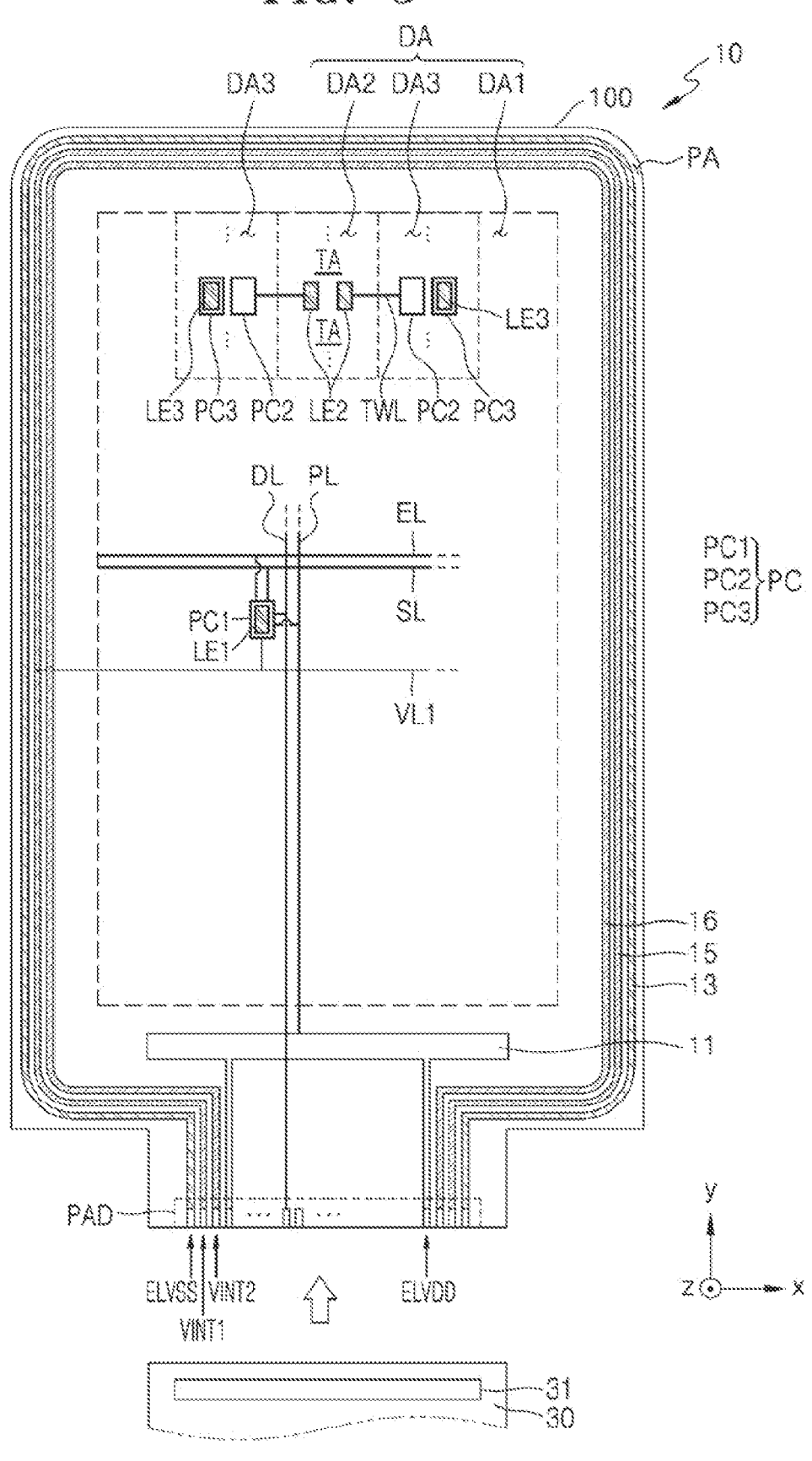
FIGS. 5 and 6 are plan views each schematically illustrating a part of a display device provided in the electronic apparatus according to embodiments.
Figure 6:
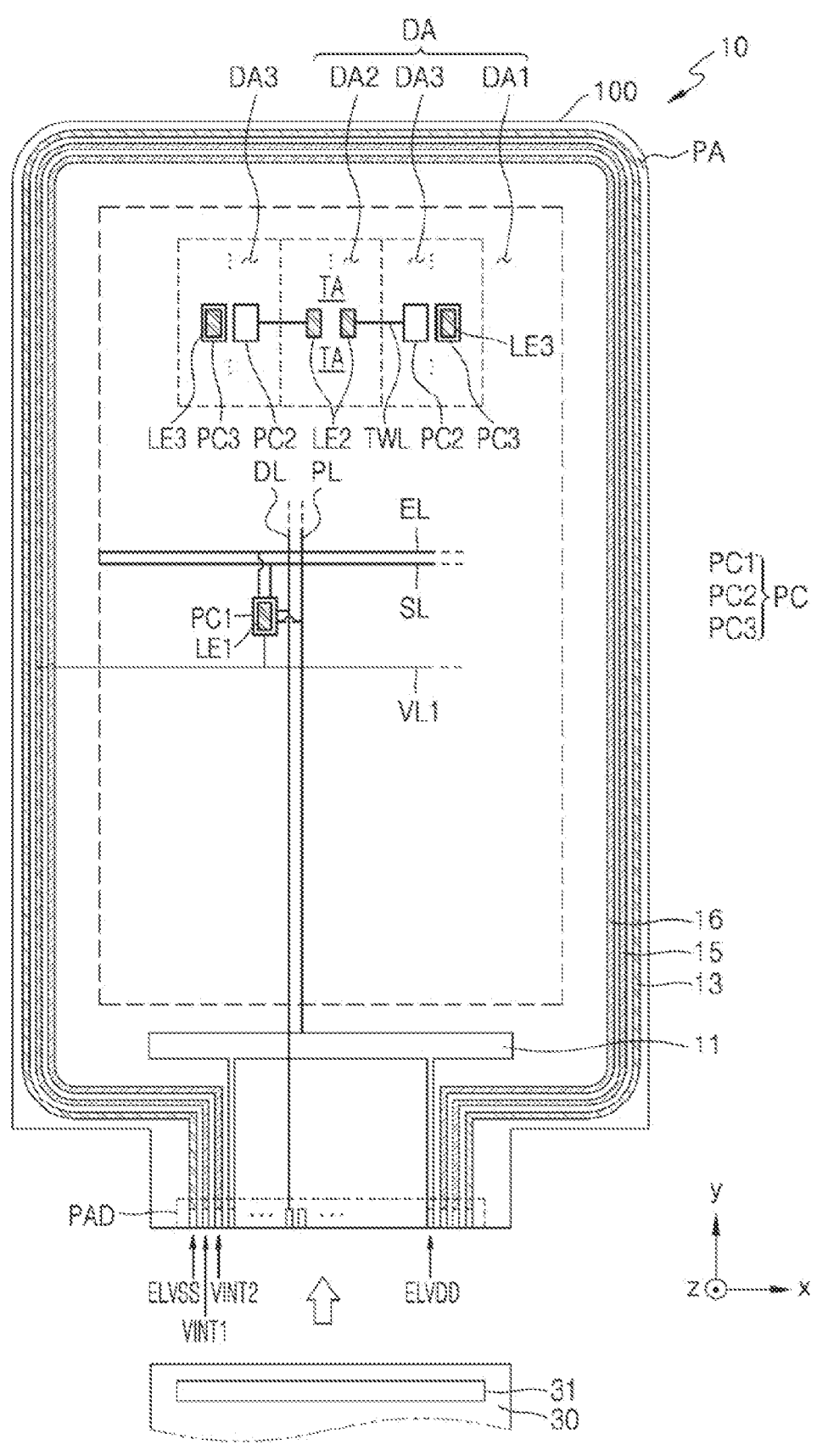

FIGS. 5 and 6 are plan views each schematically illustrating a part of a display device provided in the electronic apparatus according to embodiments.

Referring to FIG. 5, one or more suitable components constituting the display device 10 may be arranged on the substrate 100. The display device 10 may include a display area DA and a peripheral area PA disposed outside (e.g., around) the display area DA. The display area DA may include a first display area DA1, a second display area DA2 adjacent to the first display area DA1 and including a transmission area TA, and a third display area DA3 between the first display area DA1 and the second display area DA2. The peripheral area PA may be disposed outside (e.g., around) the first display area DA1, the second display area DA2, and the third display area DA3.

A plurality of first light emitting elements LE1 and a plurality of first pixel circuits PC1, which are connected (e.g., electrically connected) to each other, may be arranged in the first display area DA1. Each of the first light emitting elements LE1 may be, for example, an organic light emitting diode (OLED), and may emit light of a color (e.g., a predetermined color). Each of the first light emitting elements LE1 may emit, for example, red light, green light, blue light, or white light. Each of the first pixel circuits PC1 may drive the first light emitting element LE1. For example, the first pixel circuit PC1 may be disposed to overlap (e.g., overlap in the thickness direction of the substrate 100) the first light emitting element LE1.

As shown in FIG. 5, the second display area DA2 may be located at at least one side of the entire display area DA, and may be at least partially surrounded by the first display area DA1. A plurality of second light emitting elements LE2 may be arranged in the second display area DA2. Each of the second light emitting elements LE2 may be, for example, an organic light emitting diode (OLED), and may emit light of a color (e.g., a predetermined color). Each of the second light emitting elements LE2 may emit, for example, red light, green light, blue light, or white light.

The second display area DA2 may include a transmission area TA. The transmission area TA may be disposed to surround the second light emitting elements LE2. In one or more embodiments, the transmission area TA may be disposed in a lattice form with the plurality of second light emitting elements LE2.

The third display area DA3 is disposed between the first display area DA1 and the second display area DA2. For example, as shown in FIG. 5, the third display area DA3 may be disposed at the left side (e.g., a side in the −x direction) and/or right side (e.g., a side in the +x direction) of the second display area DA2 in a plan view. As another example, the third display areas DA3 may be disposed at the upper side (e.g., a side in the +y direction) and lower side (e.g., a side in the −y direction) of the second display area DA2. As another example, the third display areas DA3 may be disposed at the left side, right side, upper side, and lower side of the second display area DA2. Hereinafter, for convenience of description, a case in which the third display areas DA3 are disposed on the left and right sides of the second display area DA2 is described. For example, as shown in FIG. 5, the second display area DA2 may be between the third display areas DA3.

In an embodiment, a plurality of second pixel circuits PC2 may be arranged in the third display area DA3. The plurality of second pixel circuits PC2 may be connected (e.g., electrically connected) to the plurality of second light emitting elements LE2 to drive the plurality of second light emitting elements LE2, respectively. For example, each of the plurality of second pixel circuits PC2 may be connected (e.g., electrically connected) to the plurality of second light emitting elements LE2 through a transparent conductive line TWL.

In an embodiment, the second pixel circuit PC2 may be disposed in the third display area DA3 adjacent to the second display area DA2. For example, the second pixel circuit PC2 may be disposed adjacent to the outer side of the second display area DA2. The second pixel circuit PC2 and the second light emitting element LE2 may be connected (e.g., electrically connected) to each other by, for example, a transparent conductive line TWL extending in the +x direction or the −x direction. In this case, the transparent conductive line TWL may extend in substantially the same direction as the scan line SL, for example. As such, because the second pixel circuit PC2 is not disposed in the second display area DA2, the area of the transmission area TA may be sufficiently secured, and thus, the light transmittance of the second display area DA2 may be improved.

In an embodiment, a plurality of third light emitting elements LE3 and a plurality of third pixel circuits PC3, which are connected (e.g., electrically connected) to each other, may be arranged in the third display area DA3. Each of the third light emitting elements LE3 may be, for example, an organic light emitting diode (OLED), and may emit light of a color (e.g., a predetermined color). Each of the third light emitting elements LE3 may emit, for example, red light, green light, blue light, or white light. Each of the third pixel circuits PC3 may drive the third light emitting element LE3. For example, the third pixel circuit PC3 may be disposed to overlap (e.g., overlap in the thickness direction of the substrate 100) the third light emitting element LE3. As another example, the third light emitting element LE3 may be disposed to overlap (e.g., overlap in the thickness direction of the substrate 100) at least a part of the second pixel circuit PC2 disposed in the third display area DA3.

Driving circuits for respectively providing electrical signals to the first pixel circuit PC1, the second pixel circuit PC2, and the third pixel circuit PC3 through the scan line SL and/or the emission control line EL may be arranged in the peripheral area PA. In an embodiment, a pad unit PAD, a driving voltage supply line 11, a common voltage supply line 13, a first initialization voltage supply line 15, and a second initialization voltage supply line 16 may be arranged in the peripheral area PA.

The pad unit PAD may be disposed at one side of the substrate 100. The pad unit PAD is exposed without being covered by an insulating layer to be connected to a display circuit board 30. A display driver 31 may be disposed on the display circuit board 30. For example, the display driver 31 may be disposed on the display circuit board 30 in a chip on film (COF) method. As another example, the display driver 31 may also be disposed directly on the substrate 100 in a chip on glass (COG) or chip on plastic (COP) method.

The display driver 31 may generate a control signal transmitted to a scan driving circuit. The display driver 31 generates data signals, and the generated data signals may be transmitted to pixel circuits PC arranged in each column through a data line DL or a data line DL connected to a connection line-pattern unit to be described later. For example, the data line DL may be disposed in the first display area DA1, and may extend in a column direction (e.g., +y direction and/or −y direction). In one or more embodiments, separate wirings extending from the data line DL may be provided to transmit the data signals to the second pixel circuits PC2.

The display driver 31 may supply a driving power voltage ELVDD to the driving voltage supply line 11, and may supply a common power voltage ELVSS to the common voltage supply line 13. The driving power voltage ELVDD may be applied to each pixel circuit PC through a driving voltage line PL connected to the driving voltage supply line 11. In one or more embodiments, separate wirings extending from the driving voltage supply line 11 may be provided to apply the driving power voltage ELVDD to the second pixel circuits PC2. The common power voltage ELVSS may be applied to the counter electrode of each of the first to third light emitting elements LE1, LE2, and LE3 connected (e.g., electrically connected) to the common voltage supply line 13.

The driving voltage supply line 11 may extend, for example, in the +x direction under the first display area DA1. The common voltage supply line 13 may have a loop shape with one side open, and may thus partially surround the first display area DA1.

In one or more embodiments, the display driver 31 may supply a first initialization voltage VINT1 to the first initialization voltage supply line 15. The first initialization voltage supply line 15 may be configured to provide the first initialization voltage VINT1 to each of the plurality of first pixel circuits PC1 through the first initialization voltage line VL1 connected to the first initialization voltage supply line 15.

According to an embodiment of the present disclosure, the display device 10 may include a second initialization voltage supply line 16 for supplying a separate initialization voltage to the second pixel circuit PC2. For example, the display driver 31 may supply a second initialization voltage VINT2 of a different level from the first initialization voltage VINT1 to the second initialization voltage supply line 16. The second initialization voltage supply line 16 may be configured to provide the second initialization voltage VINT2 to each of the plurality of second pixel circuits PC2.

Each of the first initialization voltage supply line 15 and the second initialization voltage supply line 16 may have a loop shape with one side open, and may thus may partially surround the first display area DA1.

In an embodiment, the level of the second initialization voltage VINT2 applied to the second pixel circuit PC2 may be different from the level of the first initialization voltage VINT1 applied to the first pixel circuit PC1. For example, the first pixel circuit PC1 disposed in the first display area DA1 and the second pixel circuit PC2 disposed in the second display area DA2 may receive different initialization voltages from each other.

As described above, because the first display area DA1 and the second display area DA2 have different resolutions from each other, when the same initialization voltage is applied to the first pixel circuit PC1 and the second pixel circuit PC2, a luminance difference may occur between the first display area DA1 and the second display area DA2. When this luminance difference is recognized by a user, a sense of heterogeneity may be caused between the first image and the second image respectively provided by the first display area DA1 and the second display area DA2, or display quality may be deteriorated.

However, according to an embodiment of the present disclosure, the first initialization voltage VINT1 and the second initialization voltage VINT2, different from each other, may be applied to the first pixel circuit PC1 and the second pixel circuit PC2, respectively, thereby preventing, minimizing, or reducing the luminance difference between the first display area DA1 and the second display area DA2. Thus, display quality may be improved.

Referring to FIG. 6, as another embodiment, the second display area DA2 and the third display area DA3 may be disposed inside the first display area DA1 to be entirely surrounded by the first display area DA1.

Figure 7:
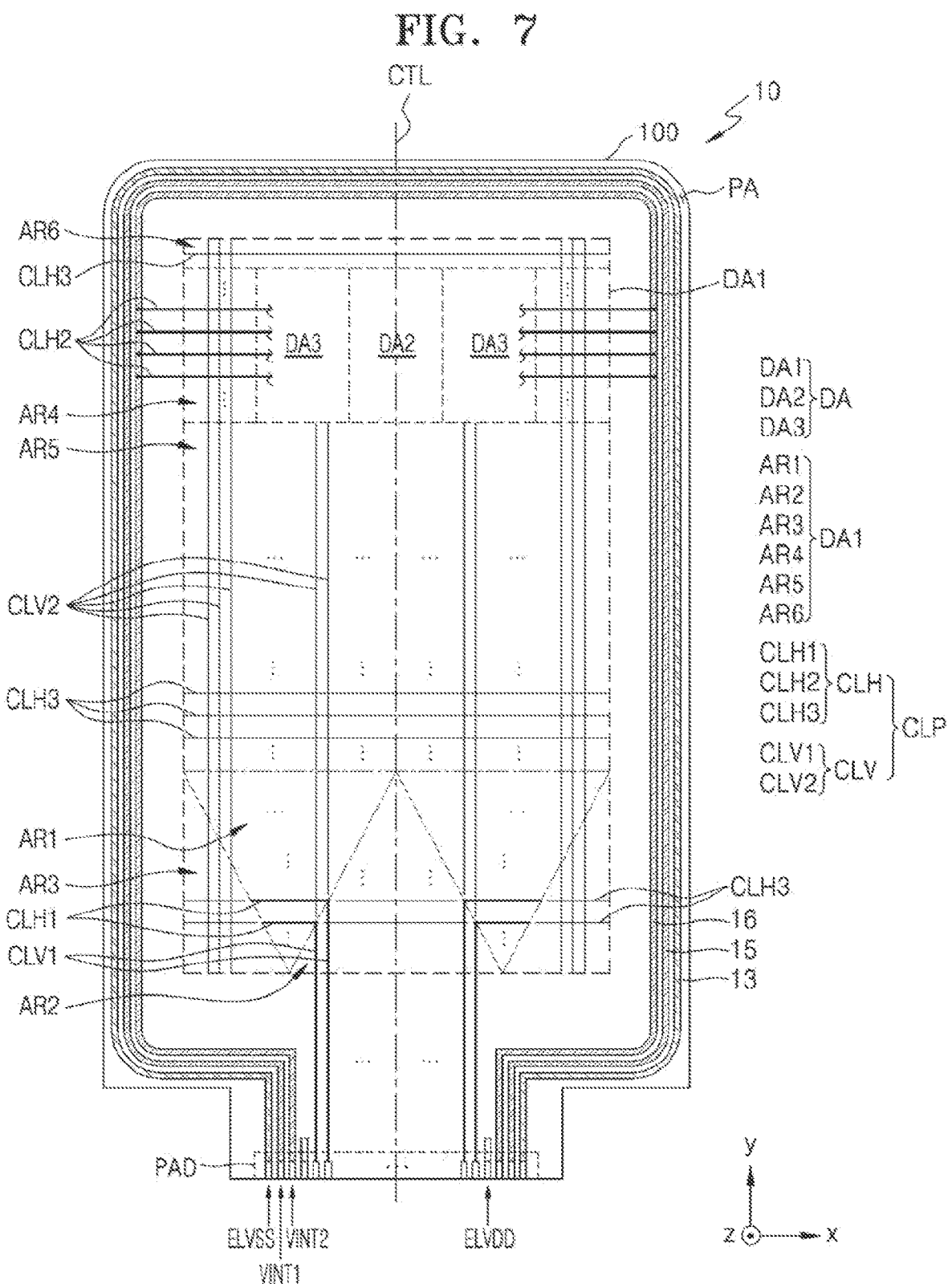
FIG. 7 is a plan view schematically illustrating a part of a display device provided in an electronic apparatus according to another embodiment.

FIG. 7 is a plan view schematically illustrating a part of a display device provided in an electronic apparatus according to another embodiment.

Referring to FIG. 7, the display device 10 may include a connection line-pattern unit CLP including a plurality of horizontal connection lines CLH extending in a row direction (e.g., +x direction and/or −x direction) and a plurality of vertical connection lines CLV extending in a column direction (e.g., +y direction and/or −y direction).

Some of the plurality of horizontal connection lines CLH of the connection line-pattern unit CLP may be insulated from the others, and some of the plurality of vertical connection lines CLV of the connection line-pattern unit CLP may be insulated from the others. The plurality of horizontal connection lines CLH and plurality of vertical connection lines CLV of the connection line-pattern unit CLP may be arranged on or at different layers from each other (e.g., different layers from each other in a cross-section), and an insulating layer may be provided therebetween. Some of the plurality of horizontal connection lines CLH may be connected (e.g., electrically connected) to some of the plurality of vertical connection lines CLV through a contact hole (e.g., a contact hole defined by the insulating layer).

The display device 10 may be symmetrical with respect to (e.g., about) a virtual center line CTL that passes through the center of the display device 10 and extends in the column direction. Hereinafter, for convenience of description, a connection line-pattern unit CLP disposed at the left side with respect to the virtual center line CTL is primarily described, and the following descriptions may be equally applied to a connection line-pattern unit CLP disposed at the right side with respect to the virtual center line CTL.

In an embodiment, the first display area DA1 may include first to sixth areas AR1, AR2, AR3, AR4, AR5, and AR6 partitioned according to the layout and arrangement of the connection line-pattern unit CLP. The first area AR1 may be an area in which first horizontal connection lines CLH1 of the plurality of horizontal connection lines of the connection line-pattern unit CLP are arranged. The second area AR2 may be an area in which first vertical connection lines CLV1 of the plurality of vertical connection lines of the connection line-pattern unit CLP are arranged. The third area AR3 may be an area surrounded by the peripheral area PA and the first area AR1.

The fourth area AR4 may be an area in which second horizontal connection lines CLH2 of the plurality of horizontal connection lines of the connection line-pattern unit CLP are arranged, and may be an area located at both sides (e.g., opposite sides) of the second display area DA2 along the row direction (e.g., +x direction or −x direction) of the first display area DA1. For example, the fourth area AR4 may overlap the second display area DA2 when viewed in the row direction.

The fifth area AR5 may be an area between the first area AR1 and the fourth area AR4 in a plan view. The sixth area AR6 may be an area disposed on the second display area DA2 and the third display area DA3 in the first display area DA1.

According to one or more embodiments, when the second display area DA2 and the third display area DA3 are located at the upper side of the entire display area DA and are adjacent to the peripheral area PA, the sixth area AR6 may not be provided.

The third area AR3, the fifth area AR5, and the sixth area AR6 may be areas in which third horizontal connection lines CLH3 of the plurality of horizontal connection lines CLH of the connection line-pattern unit CLP and second vertical connection lines CLV2 of the plurality of vertical connection lines CLV of the connection line-pattern unit CLP are arranged.

As shown in FIG. 7, the first area AR1 may have an inverted triangular shape as a whole in a plan view, and each of the second area AR2 and the third area AR3 may have a substantially triangular shape in a plan view. In one or more embodiments, the third area AR3 may have a shape of a right-angled triangle in which one vertex is rounded. Each of the fourth to sixth areas AR4, AR5, and AR6 may have a substantially rectangular shape. In one or more embodiments, the fourth to sixth areas AR4, AR5, and AR6 may be different in size (e.g., planar area) from each other in a plan view. In one or more embodiments, when the second display area DA2 has a shape (e.g., a circle) other than a rectangle, the fourth to sixth areas AR4, AR5, and AR6 around (e.g., surrounding) the second display area DA2 may have an irregular shape in a plan view. However, the arrangement and shapes of the first to sixth areas AR1, AR2, AR3, AR4, AR5, and AR6 shown in FIG. 7 are mere examples, and the present disclosure is not limited thereto.

In an embodiment of the present disclosure, the first vertical connection lines CLV1 of the plurality of vertical connection lines CLV of the connection line-pattern unit CLP may extend in a column direction (e.g., +y direction or −y direction), and may be connected (e.g., electrically connected) to the pad unit PAD. In one or more embodiments, the first vertical connection line CLV1 may be directly connected to the pad unit PAD, and in another embodiment, the first vertical connection line CLV1 may be connected (e.g., electrically connected) to the pad unit PAD through a separate input line disposed between the first display area DA1 and the pad unit PAD.

The first horizontal connection lines CLH1 of the plurality of horizontal connection lines CLH of the connection line-pattern unit CLP may extend in a row direction (e.g., +x direction or −x direction), and may be connected to corresponding first vertical connection lines CLV1, respectively. For example, the first horizontal connection line CLH1 may extend from the first vertical connection line CLV1 in a row direction. One end of the first horizontal connection line CLH1 may be connected to the first vertical connection line CLV1, and may be located in the first display area DA1. The one end of the first horizontal connection line CLH1 may define any one edge (e.g., any one side of an inverted triangle) of the first area AR1. The other end of the first horizontal connection line CLH1 may also be located in the first display area DA1, and may define another edge (e.g., another side of an inverted triangle) of the first area AR1. The above-described first vertical connection lines CLV1 and first horizontal connection lines CLH1 may function to transmit data signals from the pad unit PAD to a data line. This will be described later with reference to FIGS. 8 and 9.

The second horizontal connection lines CLH2 of the plurality of horizontal connection lines CLH of the connection line-pattern unit CLP may extend in a row direction (e.g., +x direction or −x direction). One end of each of the second horizontal connection lines CLH2 may be connected to the second initialization voltage supply line 16, and the other end thereof may be located in the third display area DA3. The second horizontal connection lines CLH2 may function to transmit the second initialization voltage from the second initialization voltage supply line 16 to the second pixel circuit disposed in the third display area DA3. This will be described later with reference to FIGS. 10 and 11.

Third horizontal connection lines CLH3 of the plurality of horizontal connection lines CLH of the connection line-pattern unit CLP and second vertical connection lines CLV2 among the plurality of vertical connection lines CLV of the connection line-pattern unit CLP may be insulated from each other without being connected (e.g., electrically connected) to each other. Among the plurality of horizontal connection lines CLH, horizontal connection lines (e.g., residual horizontal connection lines) other than the first horizontal connection lines CLH1 and the second horizontal connection lines CLH2 may be defined as third horizontal connection lines CLH3. In one or more embodiments, among the plurality of vertical connection lines CLV, vertical connection lines (e.g., residual vertical connection lines) other than the first vertical connection lines CLV1 may be defined as second horizontal connection lines CLV2.

In an embodiment, the third horizontal connection lines CLH3 and the second vertical connection lines CLV2 may be connected (e.g., electrically connected) to each other or insulated from each other. The connection relationship between the third horizontal connection lines CLH3 and the second vertical connection lines CLV2 may be variously modified in a suitable manner according to functions of the third horizontal connection lines CLH3 and the second vertical connection lines CLV2. The third horizontal connection lines CLH3 and the second vertical connection lines CLV2 may function to transmit the driving power voltage ELVDD or the common power voltage ELVSS. This will be described later with reference to FIGS. 12 to 14.

Figure 8:
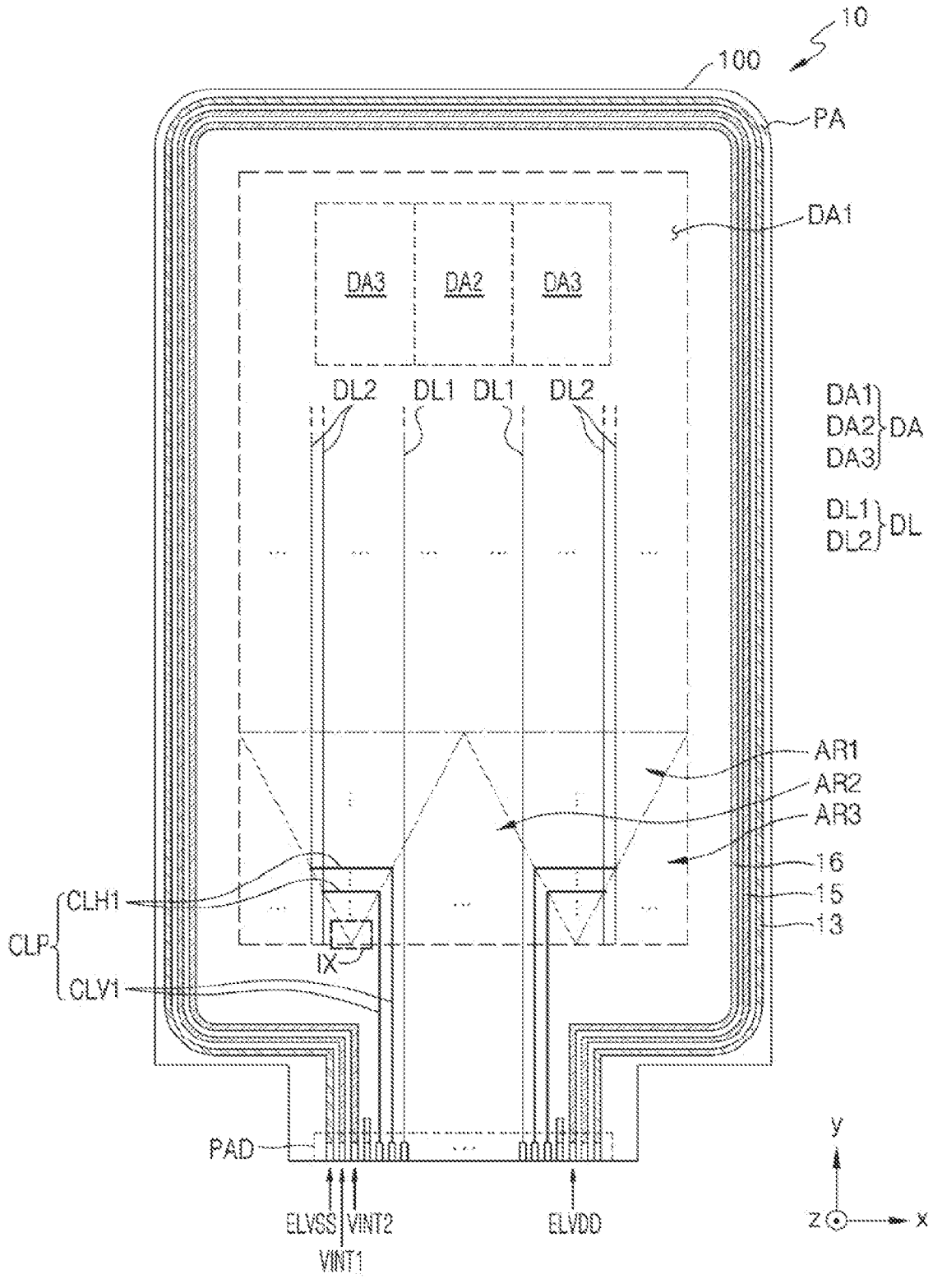
FIG. 8 is a plan view schematically illustrating a part of a display device provided in an electronic apparatus according to another embodiment.

FIG. 8 is a plan view schematically illustrating a part of a display device provided in an electronic apparatus according to another embodiment, and primarily illustrates data lines, and first horizontal connection lines and first vertical connection lines of a connection line-pattern unit.

Referring to FIG. 8, the display device 10 may include a plurality of data lines DL for applying data signals to the pixel circuits PC (e.g., see FIG. 6) located in the display area DA. The plurality of data lines DL may be arranged on the substrate 100, and may be arranged substantially parallel to each other. The plurality of data lines DL may cross the display area DA, and extend in a column direction (e.g., +y direction or −y direction).

In an embodiment, the first data line DL1 of the plurality of data lines DL may be connected (e.g., electrically connected) to the pad unit PAD without passing through the connection line-pattern unit CLP. On the other hand, the second data line DL2 of the plurality of data lines DL may be connected (e.g., electrically connected) to the pad unit PAD through a part of the connection line-pattern unit CLP. First horizontal connection lines CLH1 among the plurality of horizontal connection lines CLH of the connection line-pattern unit CLP and first vertical connection lines CLV1 of the plurality of vertical connection lines CLV of the connection line-pattern unit CLP may be connected (e.g., electrically connected) between the second data line DL2 and the pad unit PAD. For example, the first vertical connection line CLV1 may be connected (e.g., electrically connected) to the pad unit PAD, and the first horizontal connection line CLH1 may be connected (e.g., electrically connected) between the first vertical connection line CLV1 and the second data line DL2. For example, one end of the first horizontal connection line CLH1 may be connected (e.g., electrically connected) to the second data line DL2, the other end of the first horizontal connection line CLH1 may be connected (e.g., electrically connected) to the first vertical connection line CLV1, and one end of the first vertical connection line CLV1 may be connected (e.g., electrically connected) to the pad unit PAD.

Because the length of the pad unit PAD in the row direction is smaller (or less) than the width of the display area DA of the display device 10 in the row direction, fan-out wiring for connecting the pad unit PAD and the data lines DL to each other may be required. As a comparative example, when the pad unit PAD and the data lines DL are connected to each other through the fan-out wirings arranged in the peripheral area PA as a whole, the dead space of the display device 10 may increase. However, according to an embodiment of the present disclosure, because the first horizontal connection lines CLH1 and first vertical connection lines CLV1 arranged in the first display area DA1 connect the pad unit PAD and the data lines DL to each other, the dead space of the display device 10 may be minimized or reduced.

In one or more embodiments, although FIG. 8 illustrates a case in which the first data line DL1 of the plurality of data lines DL is directly connected to the pad unit PAD, the present disclosure is not limited thereto. Even when the first data line DL1 is connected (e.g., electrically connected) to the pad unit PAD through a separate input line disposed in the peripheral area PA and extending from the pad unit PAD in the column direction, the present disclosure may be applied. In this case, the second data line DL2 may be connected to the input line through the first horizontal connection line CLH1 and the first vertical connection line CLV1, and may be connected (e.g., electrically connected) to the pad unit PAD through the input line.

Figure 9:
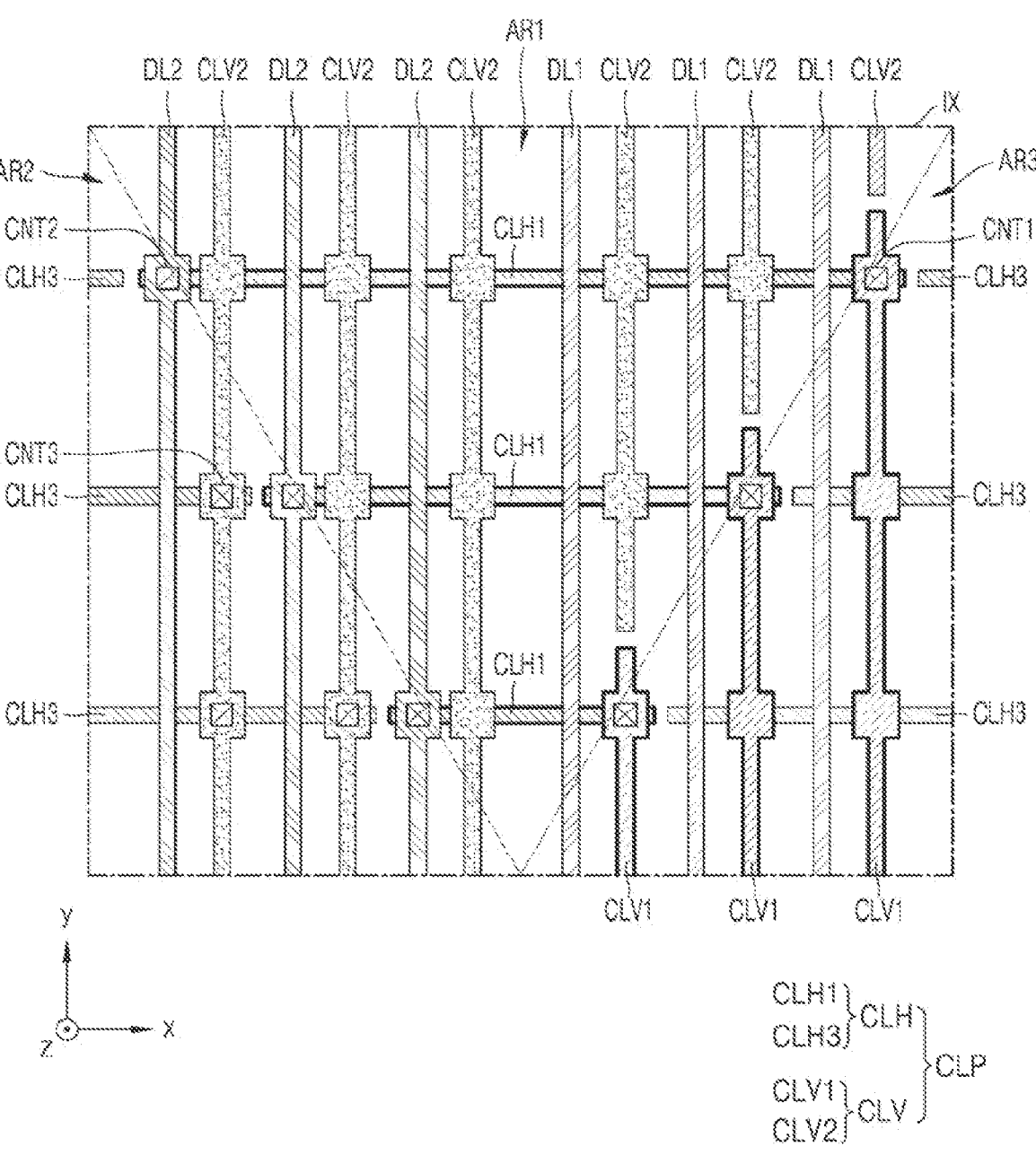
FIG. 9 is an enlarged plan view schematically illustrating a part of the display device of FIG. 8.

FIG. 9 is an enlarged plan view schematically illustrating a part of the display device of FIG. 8, and may correspond to the portion IX of the display device of FIG. 8.

Referring to FIG. 9, the first data line DL1 is not connected to the connection line-pattern unit CLP, and may extend in a column direction. The second data line DL2 may be connected to a part of the connection line-pattern unit CLP. For example, the second data line DL2 may be connected to a first horizontal connection line CLH1 of the plurality of horizontal connection lines CLH of the connection line-pattern unit CLP and a first vertical connection line CLV1 of the plurality of vertical connection lines CLV of the connection line-pattern unit CLP. The first vertical connection line CLV1 may be connected to the corresponding first horizontal connection line CLH1 through a first contact portion CNT1, and the first horizontal connection line CLH1 may be connected to the corresponding second data line DL2 through a second contact portion CNT2. In FIG. 9, the first horizontal connection lines CLH1 and the first vertical connection lines CLV1, connected to the second data line DL2, are shown as thick lines.

In an embodiment, the first contact portion CNT1, which is a portion (e.g., a conductive portion) buried in a contact hole formed in an insulating layer interposed between the first horizontal connection line CLH1 and the first vertical connection line CLV1, may be a portion for connecting the first horizontal connection line CLH1 and the first vertical connection line CLV1 disposed on or under the insulating layer. Similarly, the second contact portion CNT2, which is a portion (e.g., a conductive portion) buried in a contact hole formed in an insulating layer interposed between the first horizontal connection line CLH1 and the second data line DL2, may be a portion for connecting the first horizontal connection line CLH1 and the second data line DL2 disposed on or under the insulating layer.

In one or more embodiments, the first vertical connection lines CLV1 may have different lengths (e.g., extending lengths) in the column direction from each other according to their positions, and the first horizontal connection lines CLH1 may also have different lengths (e.g., extending lengths) in the row direction from each other according to their positions.

Figure 10:
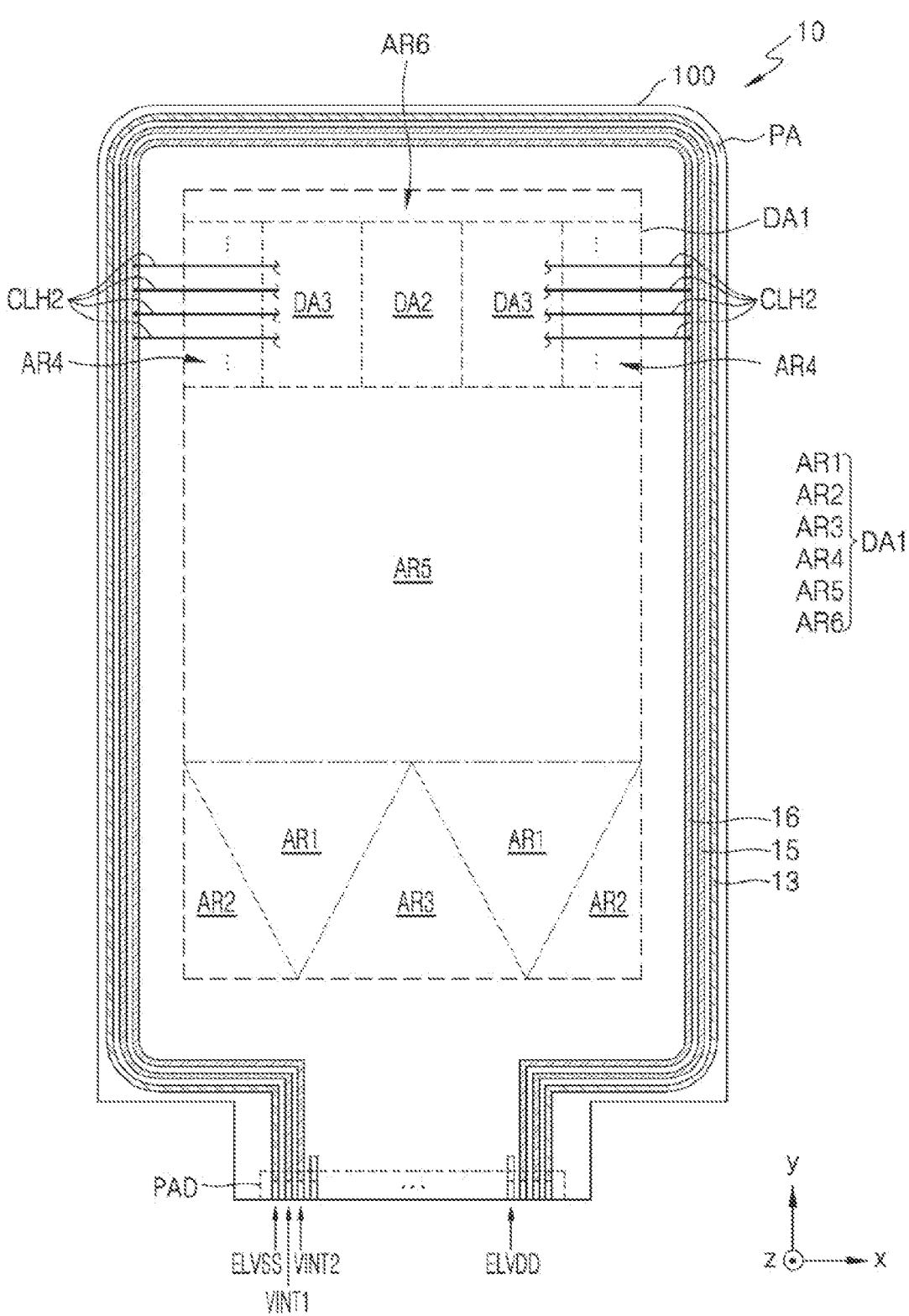
FIG. 10 is a plan view schematically illustrating a part of a display device provided in an electronic apparatus according to another embodiment.
Figure 11:
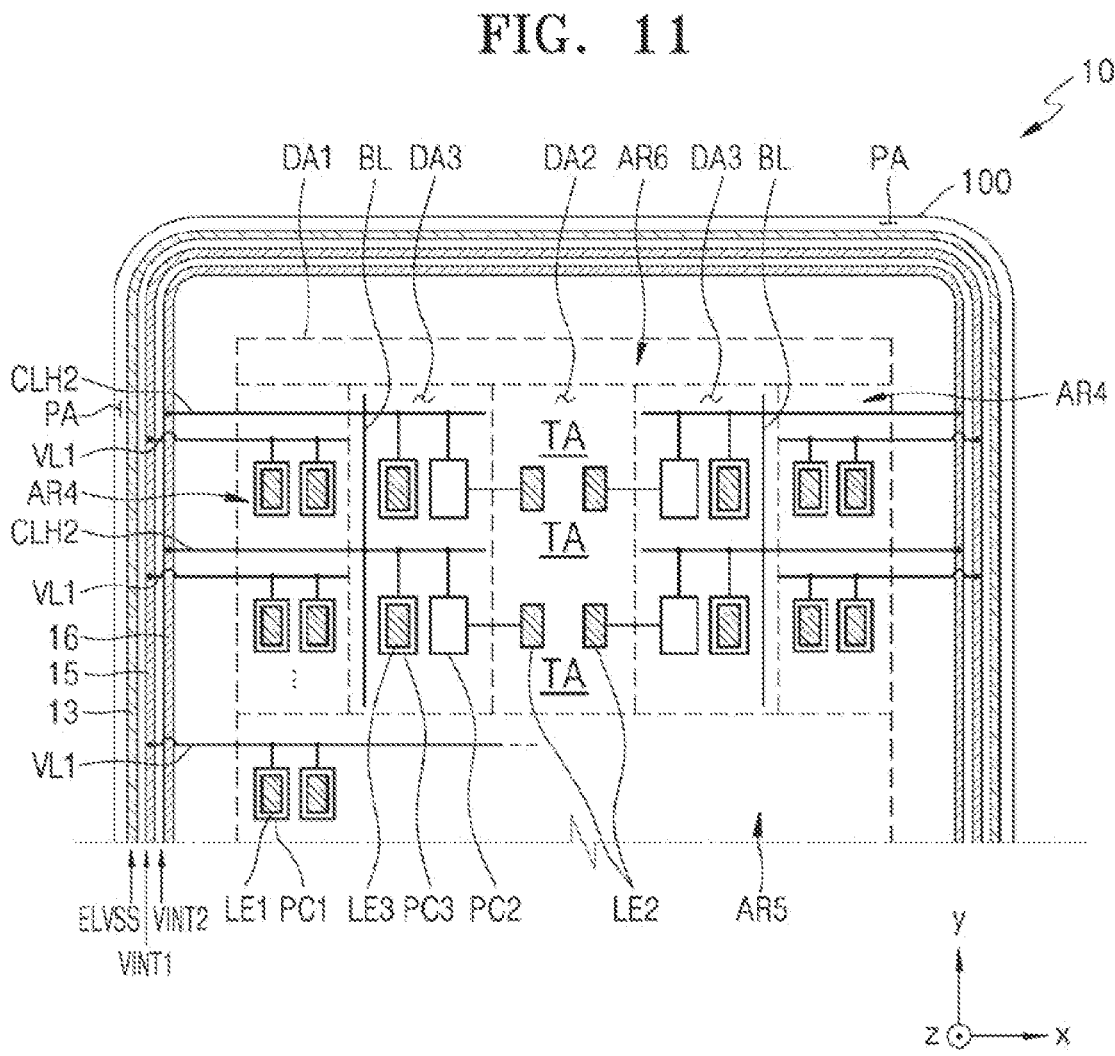
FIG. 11 is an enlarged plan view schematically illustrating a part of the display device of FIG. 10.

FIG. 10 is a plan view schematically illustrating a part of a display device provided in an electronic apparatus according to another embodiment, and FIG. 11 is an enlarged plan view schematically illustrating a part of the display device of FIG. 10. FIGS. 10 and 11 show a display device centering on a second horizontal connection line of a connection line-pattern unit.

First, referring to FIG. 10, the second horizontal connection lines CLH2 of the connection line-pattern unit CLP may be arranged in a fourth area AR4 located on both sides (e.g., opposite sides) of the second display area DA2 in the row direction of the first display area DA1. In one or more embodiments, the second display area DA2 may be between the fourth areas AR4 in the row direction. The second horizontal connection lines CLH2 may extend along the row direction. One end of the second horizontal connection line CLH2 may be connected (e.g., electrically connected) to the second initialization voltage supply line 16, and the other end of the second horizontal connection line CLH2 may be located in the third display area DA3.

Referring to FIG. 11, the display device 10 may include a plurality of first initialization voltage lines VL1 for transmitting the first initialization voltage VINT1. The plurality of first initialization voltage lines VL1 may be arranged along the column direction (e.g., the plurality of first initialization voltage lines VL1 may be spaced from each other in the column direction), and may be arranged approximately parallel to each other. The first initialization voltage lines VL1 may extend in the row direction, and may be connected to a plurality of first pixel circuits PC1 arranged along the row direction. The first initialization voltage lines VL1 may be located in the first display area DA1.

The first initialization voltage line VL1 may be configured to connect (e.g., electrically connect) the plurality of first pixel circuits PC1 and the first initialization voltage supply line 15 to each other. For example, the first initialization voltage line VL1 may be connected to the first initialization voltage supply line 15 located in the peripheral area PA, and may also be connected (e.g., electrically connected) to the first pixel circuits PC1 arranged in the corresponding row. The first initialization voltage line VL1 may be configured to transmit the first initialization voltage VINT1 received from the first initialization voltage supply line 15 to the first pixel circuits PC1.

According to an embodiment, the second horizontal connection lines CLH2 of the plurality of horizontal connection lines CLH of the connection line-pattern unit CLP may be configured to connect (e.g., electrically connect) the plurality of second pixel circuits PC2 to the second initialization voltage supply line 16. For example, each of the second horizontal connection lines CLH2 may be connected to the second initialization voltage supply line 16 located in the peripheral area PA, and may be connected (e.g., electrically connected) to the second pixel circuits PC2 arranged in the corresponding row. One end of the second horizontal connection line CLH2 may be connected to the second initialization voltage supply line 16, and the second horizontal connection line CLH2 may be configured to transmit the second initialization voltage VINT2 received from the second initialization voltage supply line to the second pixel circuits PC2.

As such, a part of the connection line-pattern unit CLP may be used without a separate line for supplying the second initialization voltage VINT2 to the second pixel circuits PC2. Accordingly, the space utilization and integration degree in the display device 10 may be improved.

According to an embodiment, the display device 10 may further include a branch line BL disposed in the third display area DA3 and extending in the column direction. The branch line BL may be connected (e.g., electrically connected) to the plurality of second horizontal connection lines CLH2. As described above, a plurality of second horizontal connection lines CLH2 may be provided, and the plurality of second horizontal connection lines CLH2 may be arranged along the column direction. For example, the plurality of second horizontal connection lines CLH2 may be spaced from each other in the column direction. The branch line BL may be connected (e.g., electrically connected) to the plurality of second horizontal connection lines CLH2 while extending in the column direction. In an embodiment, the branch line BL may be disposed in the third display area DA3, and may be disposed near a boundary between the first display area DA1 and the third display area DA3.

Through the branch line BL, the deviation of the second initialization voltages VINT2 due to a voltage drop that may occur between the second horizontal connection lines CLH2 may be minimized or reduced, and the second initialization voltage VINT2 may be uniformly and stably supplied to the second pixel circuits PC2 of several rows.

Figure 12:
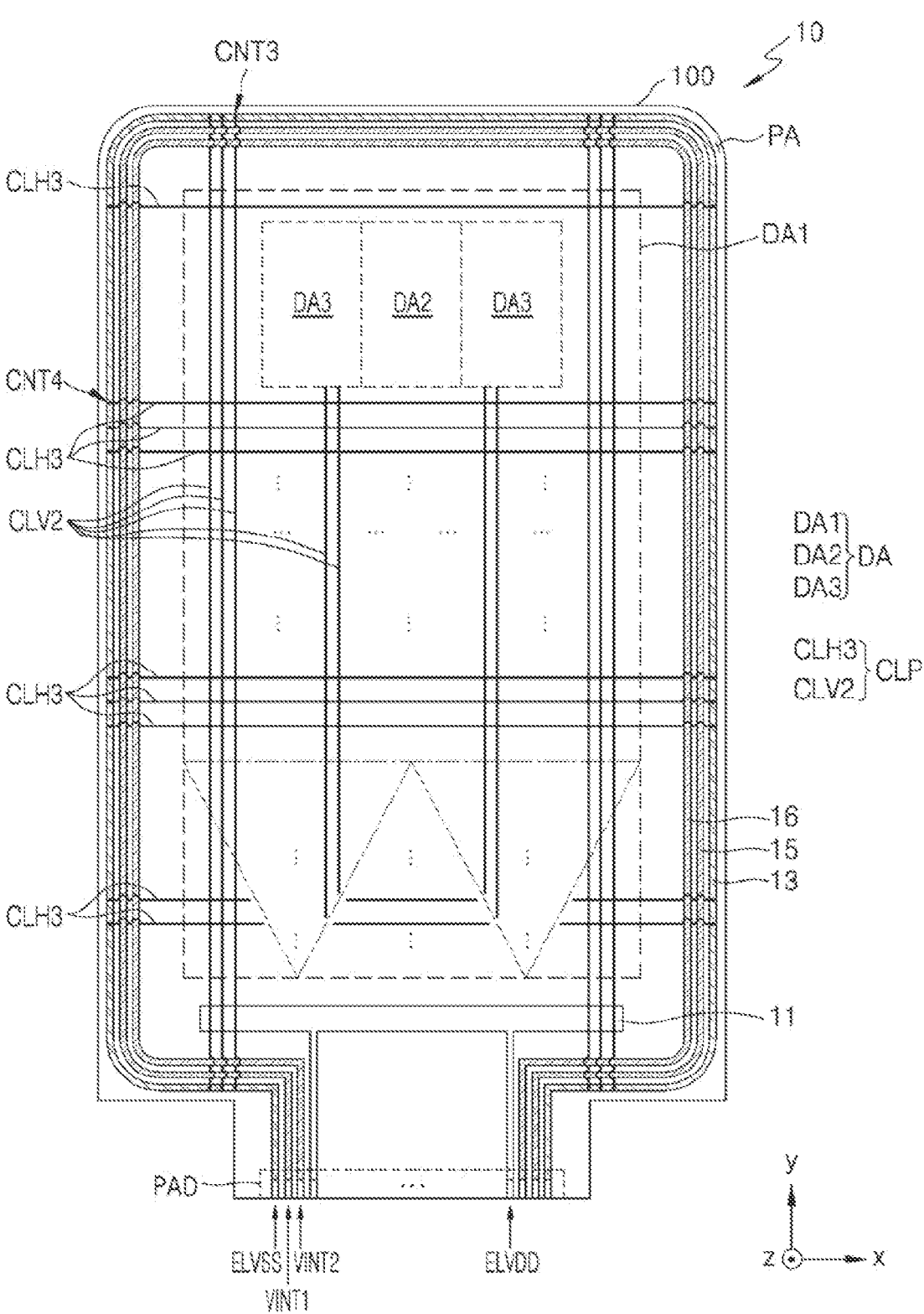
FIG. 12 is a plan view schematically illustrating a part of a display device provided in an electronic apparatus according to another embodiment.

FIG. 12 is a plan view schematically illustrating a part of a display device provided in an electronic apparatus according to another embodiment. FIG. 12 shows a display device centering on a second vertical connection line and a third horizontal connection line of a connection line-pattern unit.

Referring to FIG. 12, the display device 10 includes a common voltage supply line 13 disposed in the peripheral area PA, and the common voltage supply line 13, as described above, may provide a common power supply voltage ELVSS to the plurality of first light emitting elements LE1 (e.g., see FIG. 3) and the plurality of second light emitting elements LE2 (e.g., see FIG. 4).

In an embodiment, the second vertical connection lines CLV2 of the plurality of vertical connection lines CLV of the connection line-pattern unit CLP may be connected (e.g., electrically connected) to the common voltage supply line 13. For example, the second vertical connection lines CLV2 may extend from the display area DA to the peripheral area PA, and may be connected (e.g., electrically connected) to the common voltage supply line 13 through third contact portions CNT3 located at both ends (e.g., at opposite ends) of the second vertical connection lines CLV2.

In one or more embodiments, some of the second vertical connection lines CLV2 may not be directly connected to the common voltage supply line 13. In this case, the some second vertical connection lines CLV2 may be connected to third horizontal connection lines CLH3 to be described later, thereby receiving the common power voltage ELVSS.

In an embodiment, the third horizontal connection lines CLH3 of the plurality of horizontal connection lines CLH of the connection line-pattern unit CLP may also be connected (e.g., electrically connected) to the common voltage supply line 13. For example, the third horizontal connection lines CLH3 may extend from the display area DA to the peripheral area PA, and may be connected (e.g., electrically connected) to the common voltage supply line 13 through fourth contact portions CNT4 located at both ends (e.g., opposite ends) of the third horizontal connection lines CLH3.

In one or more embodiments, some of the third horizontal connection lines CLH3 may not be directly connected to the common voltage supply line 13. In this case, the third horizontal connection lines CLH3 may be connected to the above-described second vertical connection lines CLV2, thereby receiving the common power voltage ELVSS.

In one or more embodiments, the second vertical connection line CLV2 and the third horizontal connection line CLH3 may be in contact with each other at a portion crossing each other, and it is also possible to form a substantially mesh structure in a plan view. For example, the second vertical connection lines CLV2 and the third horizontal connection lines CLH3 may form a mesh structure in a plan view.

As such, the second vertical connection lines CLV2 and/or third horizontal connection lines CLH3 of the connection line-pattern unit CLP may be connected (e.g., electrically connected) to the common voltage supply line 13 to help the transmission of the common power voltage ELVSS. Accordingly, a voltage drop of the common power voltage ELVSS supplied to the display area DA may be minimized or reduced, and luminance uniformity of the plurality of light emitting elements LE may be improved.

Figure 13:
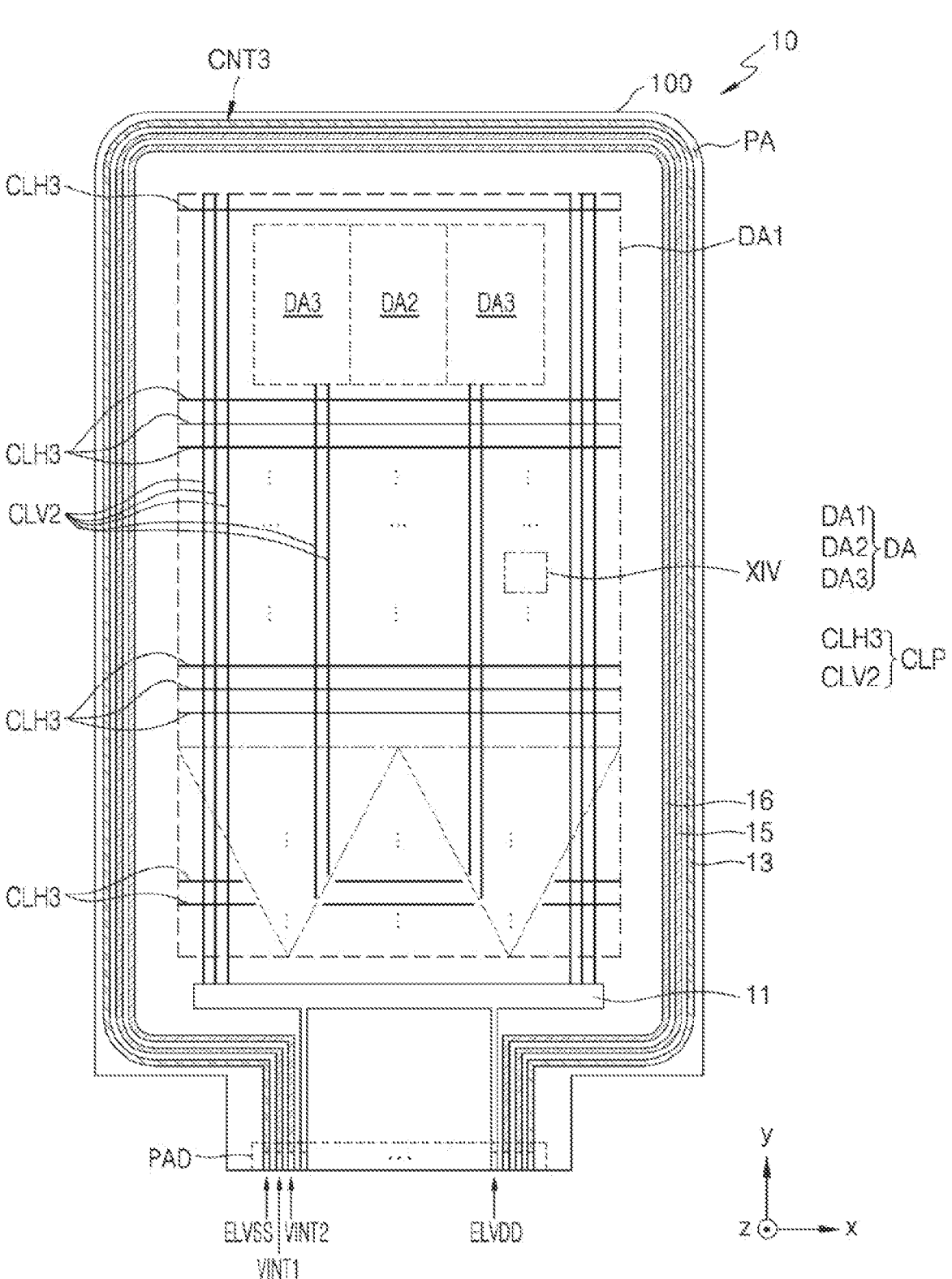
FIG. 13 is a plan view schematically illustrating a part of a display device provided in an electronic apparatus according to another embodiment.
Figure 14:
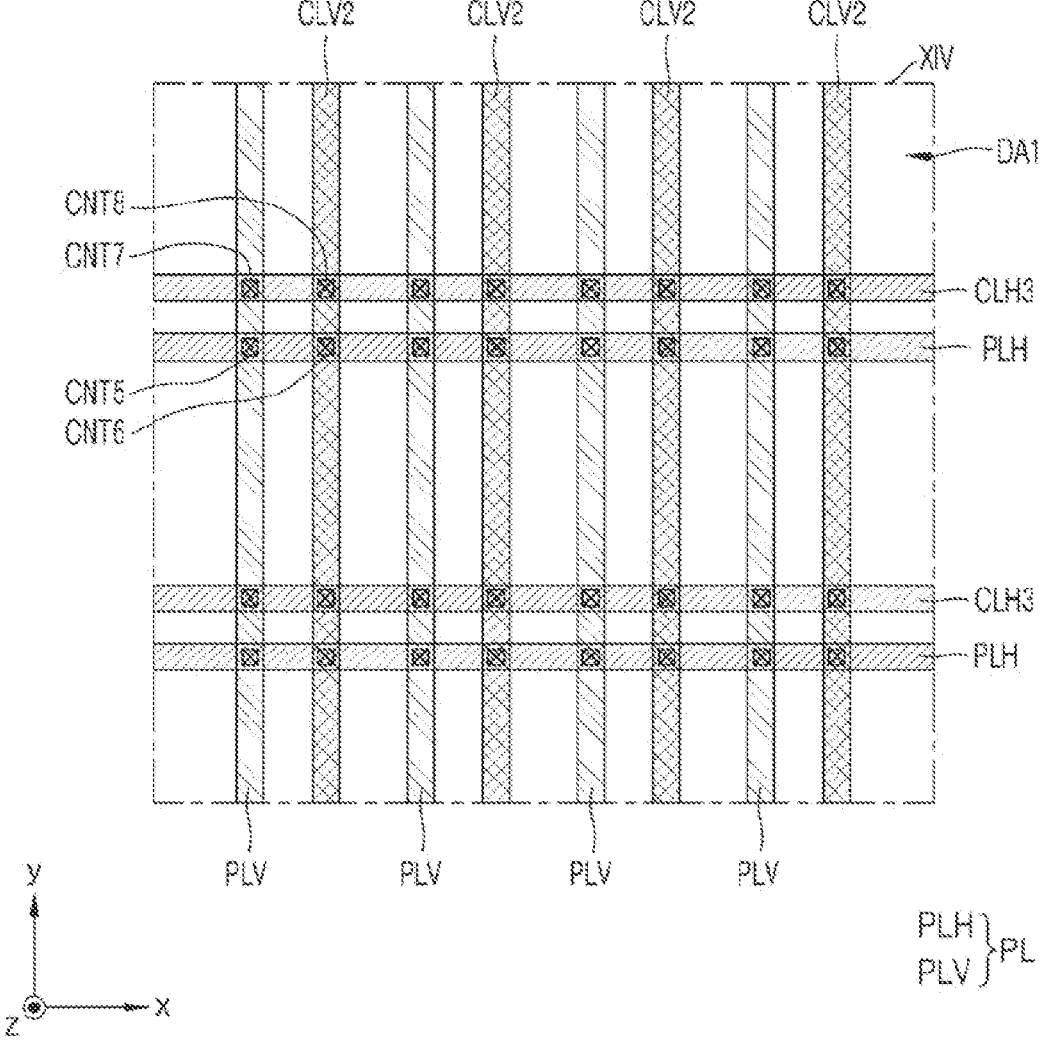
FIG. 14 is an enlarged plan view schematically illustrating a part of the display device of FIG. 13.

FIG. 13 is a plan view schematically illustrating a part of a display device provided in an electronic apparatus according to another embodiment, and FIG. 14 is an enlarged plan view schematically illustrating a part of the display device of FIG. 13.

Referring to FIGS. 13 and 14, the display device 10 includes a driving voltage supply line 11 disposed in the peripheral area PA, and the driving voltage supply line 11 may be configured to provide a driving power voltage ELVDD to the plurality of first pixel circuits PC1 (e.g., see FIG. 6), the plurality of second pixel circuits PC2 (e.g., see FIG. 6), and the plurality of third pixel circuits PC3 (e.g., see FIG. 6) through the driving voltage line PL (e.g., see FIG. 6).

In an embodiment, as shown in FIG. 14, the driving voltage line PL may include a plurality of horizontal driving voltage lines PLH extending in the row direction and a plurality of vertical driving voltage lines PLV extending in the column direction.

The plurality of horizontal driving voltage lines PLH and the plurality of vertical driving voltage lines PLV may be connected (e.g., electrically connected) to each other through a fifth contact portion CNT5, respectively, and may form a mesh structure.

In an embodiment, the second vertical connection lines CLV2 of the plurality of vertical connection lines CLV of the connection line-pattern unit CLP may be directly or indirectly connected (e.g., electrically connected) to the driving voltage supply line 11. For example, some of the second vertical connection lines CLV2 may extend from the display area DA to the peripheral area PA, and may be connected (e.g., electrically connected) to the driving voltage supply line 11 at their ends. In one or more embodiments, some of the second vertical connection lines CLV2 may be connected (e.g., electrically connected) to the horizontal driving voltage line PLH of the driving voltage line PL through a sixth contact portion CNT6.

In an embodiment, the third horizontal connection lines CLH3 of the plurality of horizontal connection lines CLH of the connection line-pattern unit CLP may be indirectly connected (e.g., electrically connected) to the driving voltage supply line 11. For example, the third horizontal connection line CLH3 may be connected (e.g., electrically connected) to the vertical driving voltage line PLV of the driving voltage line PL through a seventh contact part CNT7.

In one or more embodiments, the second vertical connection line CLV2 and the third horizontal connection line CLH3 may be in contact with each other at a portion crossing each other through an eighth contact portion CNT8, and it is also possible to form a substantially mesh structure in a plan view. For example, the second vertical connection lines CLV2 and the third horizontal connection lines CLH3 may form a mesh structure in a plan view.

As such, the second vertical connection lines CLV2 and/or third horizontal connection lines CLH3 of the connection line-pattern unit CLP may be connected (e.g., electrically connected) to the driving voltage supply line 11 to help the transmission of the driving power voltage ELVDD. Accordingly, a voltage drop of the driving power voltage ELVDD supplied to the display area DA may be minimized or reduced, and luminance uniformity of the plurality of light emitting elements LE may be improved.

In one or more embodiments, in additional embodiments, some of the second vertical connection lines CLV2 and/or some of the third horizontal connection lines CLH3 of the connection line-pattern unit CLP may be connected (e.g., electrically connected) to the common voltage supply line 13, and others thereof may be connected (e.g., electrically connected) to the driving voltage supply line 11. For example, the second vertical connection lines CLV2 and/or the third horizontal connection lines CLH3 of the connection line-pattern unit CLP may be modified in a suitable manner to help not only the transmission of the common power voltage ELVSS but also the transmission of the driving power voltage ELVDD.

Figure 15:
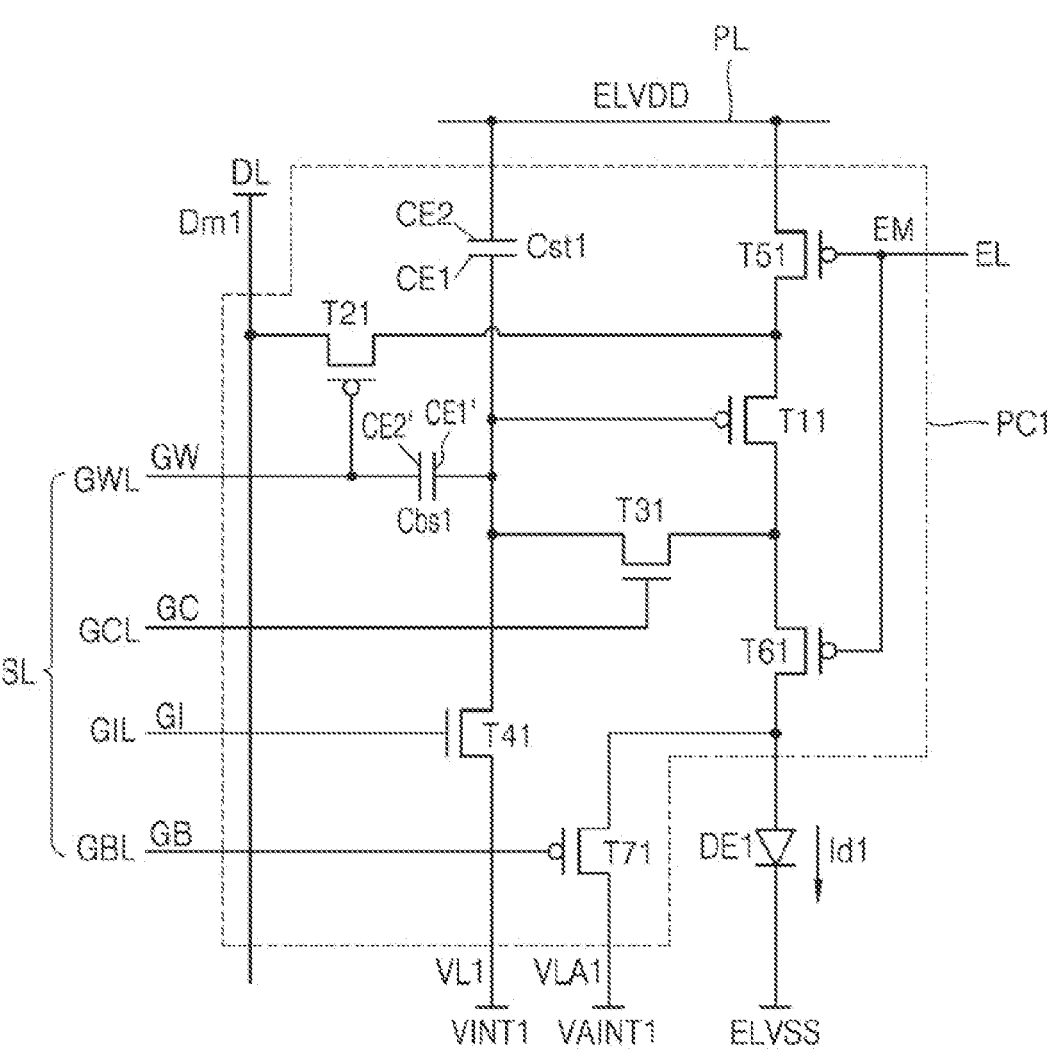
FIG. 15 is an equivalent circuit diagram of a first pixel circuit provided in an electronic apparatus according to another embodiment.

FIG. 15 is an equivalent circuit diagram of a first pixel circuit provided in an electronic apparatus according to another embodiment. FIG. 15 is a modified embodiment of FIG. 3. Hereinafter, overlapping contents will be replaced with the description of FIG. 3, and differences will be primarily described.

Referring to FIG. 15, the first pixel circuit PC1 may be connected to a first initialization voltage line VL1 for transmitting a first initialization voltage VINT1 and a first anode initialization voltage line VLA1 for transmitting a first anode initialization voltage VAINT1.

The first gate initialization transistor T41 and the first anode initialization transistor T71 may be connected to different voltage lines from each other. For example, as shown in FIG. 15, the first gate initialization transistor T41 may be connected to the first initialization voltage line VL1, and the first anode initialization transistor T71 may be connected to the first anode initialization voltage line VLA1.

The first gate initialization transistor T41 may apply the first initialization voltage VINT1 to the gate of the first driving transistor T11 in response to the third scan signal GI, and the first anode initialization transistor T71 may apply the first anode initialization voltage VAINT1 to the pixel electrode of the first light emitting element LE1 in response to the fourth scan signal GB.

The level of the first anode initialization voltage VAINT1 may be higher than the level of the first initialization voltage VINT1, and may be lower than a voltage level as high as the threshold voltage of the first light emitting element LE1 in the second driving voltage ELVSS. Because the first light emitting element LE1 has a relatively large size, it has a very large capacitance. In one or more embodiments, because the level of the first initialization voltage VINT1 is too low, the first light emitting element LE1 starts to emit light after a considerable delay time in the next frame. However, according to the present embodiment, the first light emitting element LE1 may start to emit light within a short time in the next frame by initializing the pixel electrode of the first light emitting element LE1 with the first anode initialization voltage VAINT1 having a level higher than the level of the first initialization voltage VINT1. Thus, light emission delay may be reduced.

Figure 16:
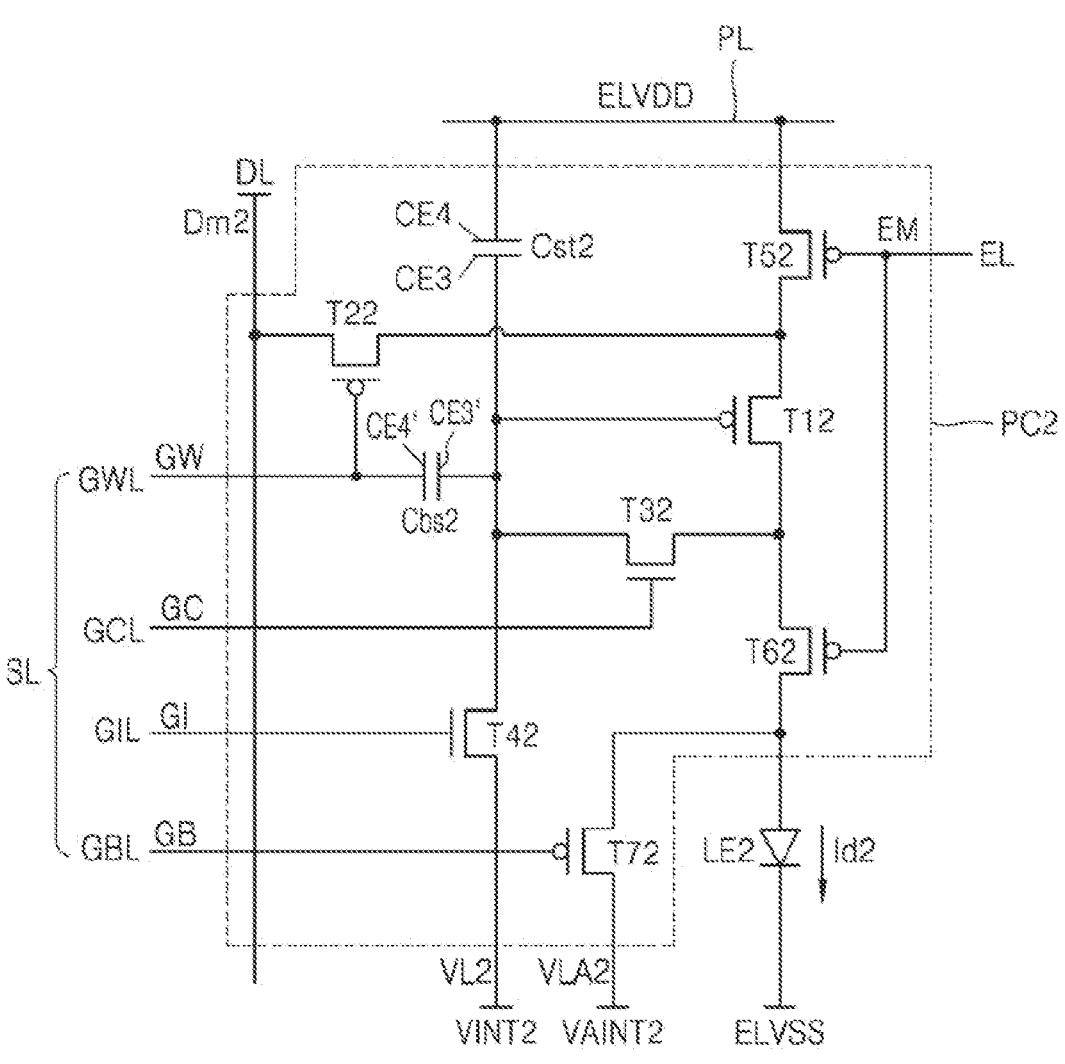
FIG. 16 is an equivalent circuit diagram of a second pixel circuit provided in the electronic apparatus according to another embodiment.

FIG. 16 is an equivalent circuit diagram of a second pixel circuit provided in the electronic apparatus according to another embodiment. FIG. 16 is a modified embodiment of FIG. 4. Hereinafter, overlapping contents will be replaced with the description of FIG. 4, and differences will be primarily described.

Referring to FIG. 16, the second pixel circuit PC2 may be connected to a second initialization voltage line VL2 for transmitting a second initialization voltage VINT2 and a second anode initialization voltage line VLA2 for transmitting a second anode initialization voltage VAINT2.

The second gate initialization transistor T42 and the second anode initialization transistor T72 may be connected to different voltage lines from each other. For example, as shown in FIG. 16, the second gate initialization transistor T42 may be connected to the second initialization voltage line VL2, and the second anode initialization transistor T72 may be connected to the second anode initialization voltage line VLA2.

The second gate initialization transistor T42 may apply the second initialization voltage VINT2 to the gate of the second driving transistor T12 in response to the third scan signal GI, and the second anode initialization transistor T72 may apply the second anode initialization voltage VAINT2 to the pixel electrode of the second light emitting element LE2 in response to the fourth scan signal GB.

The level of the second anode initialization voltage VAINT2 may be higher than the level of the second initialization voltage VINT2, and may be lower than a voltage level as high as the threshold voltage of the second light emitting element LE2 in the second driving voltage ELVSS. Because the second light emitting element LE2 has a relatively large size, it has a very large capacitance. In one or more embodiments, because the level of the second initialization voltage VINT2 is too low, the second light emitting element LE2 starts to emit light after a considerable delay time in the next frame. However, according to the present embodiment, the second light emitting element LE2 may start to emit light within a short time in the next frame by initializing the pixel electrode of the second light emitting element LE2 with the second anode initialization voltage VAINT2 having a level higher than the level of the second initialization voltage VINT2. Thus, light emission delay may be reduced.

Figure 17:
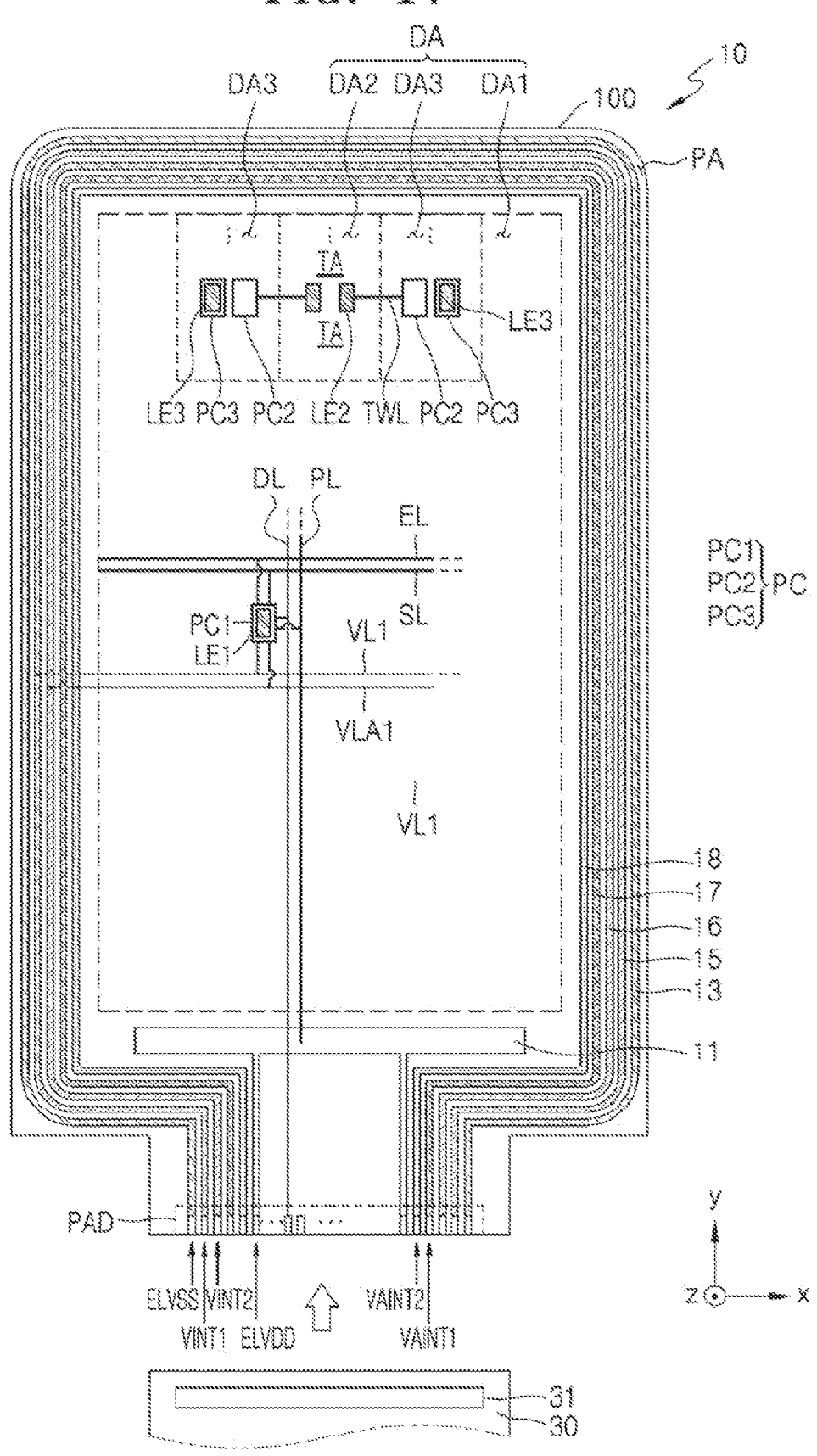
FIG. 17 is a plan view schematically illustrating a part of a display device provided in an electronic apparatus according to another embodiment.

FIG. 17 is a plan view schematically illustrating a part of a display device provided in an electronic apparatus according to another embodiment. Contents overlapping the contents described above with reference to FIGS. 5 and 6 will not be provided, and differences will be primarily described.

Referring to FIG. 17, the display device 10 may further include a first anode initialization voltage supply line 17 and a second anode initialization voltage supply line 18. The first anode initialization voltage supply line 17 may be disposed in the peripheral area PA, and may provide the first anode initialization voltage VAINT1 to each of the plurality of first pixel circuits PC1 through the first anode initialization voltage line VLA1. The second anode initialization voltage supply line 18 may be disposed in the peripheral area PA, and may provide the second anode initialization voltage VAINT2 to each of the plurality of second pixel circuits PC2.

The first anode initialization voltage supply line 17 and the second anode initialization voltage supply line 18 may have a loop shape with one side open, and may thus partially surround the first display area DA1.

In an embodiment, the level of the second anode initialization voltage VAINT2 applied to the second pixel circuit PC2 may be different from the level of the first anode initialization voltage VAINT1 applied to the first pixel circuit PC1. For example, the first pixel circuit PC1 disposed in the first display area DA1 and the second pixel circuit PC2 disposed in the second display area DA2 may receive different anode initialization voltages from each other.

As described above, because the first display area DA1 and the second display area DA2 have different resolutions, when the same anode initialization voltage is applied to the first pixel circuit PC1 and the second pixel circuit PC2, a luminance difference may occur between the first display area DA1 and the second display area DA2. When the luminance difference is recognized by a user, a sense of heterogeneity between a first image and a second image provided by the first display area DA1 and the second display area DA2, respectively, may be caused, or display quality may be deteriorated.

However, according to the present embodiment, the luminance difference between the first display area DA1 and the second display area DA2 may be prevented, minimized, or reduced by applying the first anode initialization voltage VAINT1 and the second anode initialization voltage VAINT2 having different levels to the first pixel circuit PC1 and the second pixel circuit PC2, respectively. Accordingly, display quality may be improved.

Figure 18:
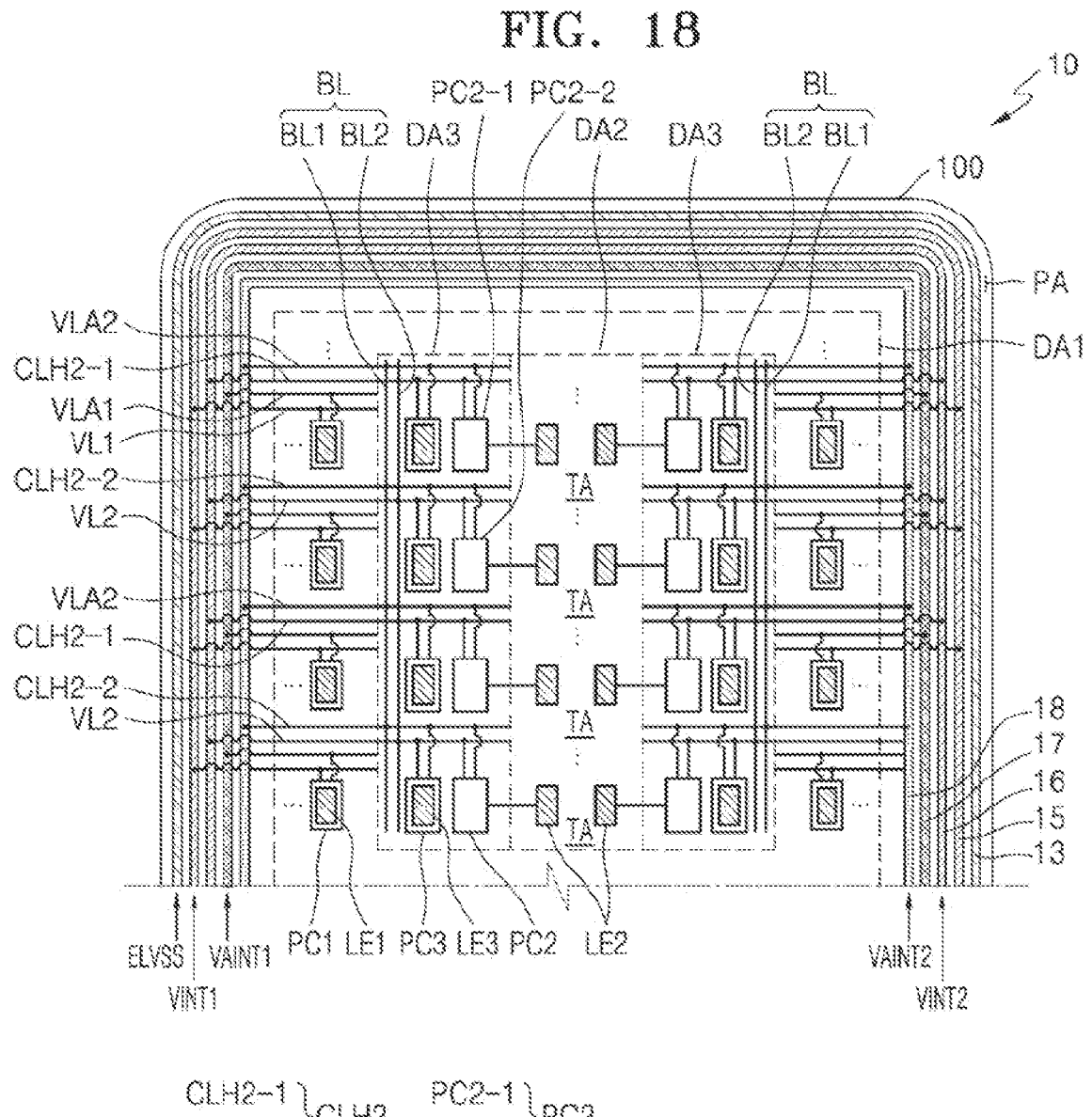
FIG. 18 is an enlarged plan view schematically illustrating a part of the display device of FIG. 17.

FIG. 18 is an enlarged plan view schematically illustrating a part of the display device of FIG. 17.

Referring to FIG. 18, the display device 10 may include a plurality of first initialization voltage lines VL1 for transmitting a first initialization voltage VINT1 and a plurality of first anode initialization voltage lines VLA1 for transmitting a first anode initialization voltage VAINT1. The plurality of first initialization voltage lines VL1 and the plurality of first anode initialization voltage lines VLA1 may be arranged along the column direction (e.g., the plurality of first initialization voltage lines VL1 and the plurality of first anode initialization voltage lines VLA1 may be spaced from each other in the column direction), and may be arranged substantially parallel to each other. The plurality of first initialization voltage lines VL1 and the plurality of first anode initialization voltage lines VLA1 may respectively extend along the row direction, and may be connected to the plurality of first pixel circuits PC1 arranged in the row direction. The plurality of first initialization voltage lines VL1 and the plurality of first anode initialization voltage lines VLA1 may be located in the first display area DA1.

The first initialization voltage line VL1 may be configured to connect (e.g., electrically connect) the plurality of first pixel circuits PC1 and the first initialization voltage supply line 15 to each other. For example, the first initialization voltage line VL1 may be connected to the first initialization voltage supply line 15 located in the peripheral area PA at one end thereof, and may be connected (e.g., electrically connected) to the first pixel circuits PC1 arranged in the corresponding row. The first initialization voltage line VL1 may be configured to transmit the first initialization voltage VINT1 received from the first initialization voltage supply line 15 to the first pixel circuits PC1.

The first anode initialization voltage line VLA1 may be configured to connect (e.g., electrically connect) the plurality of first pixel circuits PC1 and the first anode initialization voltage supply line 17 to each other. For example, the first anode initialization voltage line VLA1 may be connected to the first anode initialization voltage supply line 17 located in the peripheral area PA at one end thereof, and may be connected (e.g., electrically connected) to the first pixel circuits PC1 arranged in the corresponding row. The first anode initialization voltage line VLA1 may be configured to transmit the first anode initialization voltage VAINT1 received from the first anode initialization voltage supply line 17 to the first pixel circuits PC1.

According to an embodiment, the plurality of horizontal connection lines CLH of the connection line-pattern unit CLP may include a plurality of second horizontal connection lines CLH2 arranged in the fourth area AR4 of the first display area DA1, and the plurality of second horizontal connection lines CLH2 may respectively transmit the second initialization voltage VINT2 or the second anode initialization voltage VAINT2 to the second pixel circuits PC2. For example, the plurality of second horizontal connection lines CLH2 may be used as the second initialization voltage line VL2 or the second anode initialization voltage line VLA2. Accordingly, the space utilization and integration degree in the display device 10 may be improved.

For example, some of the plurality of second horizontal connection lines CLH2 may be configured to connect (e.g., electrically connect) some of the second pixel circuits PC2 to the second initialization voltage supply line 16, and others of the plurality of second horizontal connection lines CLH2 may be configured to connect (e.g., electrically connect) others of the second pixel circuits PC2 to the second anode initialization voltage supply line 18.

For example, the plurality of second horizontal connection lines CLH2 may include a 2-1th horizontal connection line CLH2-1 and a 2-2th horizontal connection line CLH2-2, which are spaced from each other in the column direction, and the 2-1th horizontal connection line CLH2-1 may be configured to connect the 2-1th pixel circuits PC2-1 arranged in a first row among the plurality of second pixel circuits PC2 to the second initialization voltage supply line 16. In one or more embodiments, the 2-2th horizontal connecting line CLH2-2 may be configured to connect (e.g., electrically connect) the 2-2th pixel circuits PC2-2 arranged in a second row different from the first row among the plurality of second pixel circuits PC2 to the second anode initialization voltage supply line 18. In this case, a second anode initialization voltage line VLA2 for connecting the 2-1-th pixel circuits PC2-1 to the second anode initialization voltage supply line 18 and a second initialization voltage line VL2 for connecting the second-second pixel circuits PC2-2 to the second initialization voltage supply line 16 may be provided.

In one or more embodiments, as shown in FIG. 18, a plurality of 2-1th horizontal connection lines CLH2-1 and a plurality of 2-2th horizontal connection lines CLH2-2 may be provided, respectively, and may be alternately arranged along the column direction. In other words, the 2-1th horizontal connection lines CLH2-1 connected (e.g., electrically connected) to the second initialization voltage supply line 16 and the 2-2th horizontal connection lines CLH2-2 connected (e.g., electrically connected) to the second anode initialization voltage supply line 18 may be alternately arranged with each other along the column direction.

In an embodiment, the display device 10 may further include a branch line BL disposed in the third display area DA3 and extending in the column direction. The branch line BL may be connected (e.g., electrically connected) to the plurality of second horizontal connection lines CLH2. In one or more embodiments, the branch line BL may include a first branch line BL1 connected to the 2-1th horizontal connection lines CLH2-1 and a second branch line BL2 connected to the 2-2th horizontal connection lines CLH2-2. In an embodiment, the branch line BL may be disposed in the third display area DA3, and may be disposed near a boundary between the first display area DA1 and the third display area DA3.

Through the branch line BL, the deviation of the second initialization voltages VINT2 or the deviation of the second anode initialization voltages VAINT2, due to a voltage drop that may occur between the second horizontal connection lines CLH2, may be minimized or reduced, and the second initialization voltage VINT2 and the second anode initialization voltage VAINT2 may be uniformly and stably supplied to the second pixel circuits PC2 of several rows.

In one or more embodiments, as a modified embodiment of FIG. 18, all of the plurality of second horizontal connection lines CLH2 may be used as the second anode initialization voltage line VLA2. For example, all of the plurality of second horizontal connection lines CLH2 may be configured to connect (e.g., electrically connect) the plurality of second pixel circuits PC2 to the second anode initialization voltage supply line 18. In this case, a separate second anode initialization voltage line VLA2 does not need to be provided, and only the plurality of second initialization voltage lines VL2 may be provided.

So far, only a display device and an electronic apparatus having the same have been primarily described, but the present disclosure is not limited thereto. For example, it will be understood that such a display device and a method of manufacturing an electronic apparatus having the same are also included in the scope of the present disclosure.

According to the above-described embodiments, it is possible to provide a display device in which a display area is enlarged to display an image even in an area where electronic components are arranged, and in which the second display area has the same luminance as a first display area to improve display quality and to provide an electronic apparatus including the display device. However, the scope of the present disclosure is not limited by such effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the drawings, it will be understood by those of ordinary skill in the art that one or more suitable changes in form and details may be made therein without departing from the spirit and scope as defined by the following claims, and equivalents thereof.

What is claimed is:

1. A display device comprising:
a plurality of first light emitting elements and a plurality of first pixel circuits arranged in a first display area and electrically connected to each other;
a plurality of second light emitting elements arranged in a second display area comprising a transmission area and at least partially surrounded by the first display area;
a plurality of second pixel circuits arranged in a third display area between the first display area and the second display area and electrically connected to the plurality of second light emitting elements;
a pad unit disposed in a peripheral area outside the first display area;
a data line disposed in the first display area and extending in a column direction;
a first initialization voltage supply line disposed in the peripheral area and configured to provide a first initialization voltage to the plurality of first pixel circuits;
a second initialization voltage supply line disposed in the peripheral area and configured to provide a second initialization voltage having a different level from the first initialization voltage to the plurality of second pixel circuits; and
a connection line-pattern unit comprising a plurality of horizontal connection lines extending in a row direction and a plurality of vertical connection lines extending in the column direction,
wherein a first vertical connection line of the plurality of vertical connection lines of the connection line-pattern unit is electrically connected to the pad unit,
wherein a first horizontal connection line of the plurality of horizontal connection lines of the connection line-pattern unit is configured to electrically connect the first vertical connection line to the data line, and
wherein a second horizontal connection line of the plurality of horizontal connection lines of the connection line-pattern unit is configured to electrically connect the plurality of second pixel circuits to the second initialization voltage supply line.

2. The display device of claim 1, wherein the second horizontal connection line is disposed in an area located at both sides of the second display area along the row direction in the first display area.

3. The display device of claim 1, further comprising a branch line disposed in the third display area and extending in the column direction,
wherein the second horizontal connection line comprises a plurality of second horizontal connection lines that are arranged along the column direction and electrically connected to the branch line.

4. The display device of claim 1, further comprising a common voltage supply line disposed in the peripheral area and configured to supply a common power voltage to the plurality of first light emitting elements and the plurality of second light emitting elements,
wherein a second vertical connection line of the plurality of vertical connection lines of the connection line-pattern unit is electrically connected to the common voltage supply line.

5. The display device of claim 1, further comprising a common voltage supply line disposed in the peripheral area and configured to supply a common power voltage to the plurality of first light emitting elements and the plurality of second light emitting elements,
wherein a third horizontal connection line of the plurality of horizontal connection lines of the connection line-pattern unit is electrically connected to the common voltage supply line.

6. The display device of claim 1, further comprising a driving voltage supply line disposed in the peripheral area and configured to supply a driving power voltage to the plurality of first pixel circuits and the plurality of second pixel circuits, wherein a second vertical connection line of the plurality of vertical connection lines of the connection line-pattern unit is electrically connected to the driving voltage supply line.

7. The display device of claim 1, further comprising a driving voltage supply line disposed in the peripheral area and configured to supply a driving power voltage to the plurality of first pixel circuits and the plurality of second pixel circuits, wherein a third horizontal connection line of the plurality of horizontal connection lines of the connection line-pattern unit is electrically connected to the driving voltage supply line.

8. The display device of claim 1, further comprising:

a first anode initialization voltage supply line disposed in the peripheral area and configured to provide a first anode initialization voltage to the plurality of first pixel circuits; and a second anode initialization voltage supply line disposed in the peripheral area and configured to provide a second anode initialization voltage having a different level from the first anode initialization voltage to the plurality of second pixel circuits.

9. The display device of claim 8, wherein the second horizontal connection line of the plurality of horizontal connection lines of the connection line-pattern unit comprises a 2-1th horizontal connection line and a 2-2th horizontal connection line spaced from each other along the column direction, wherein the 2-1th horizontal connection line is configured to electrically connect 2-1th pixel circuits arranged in a first row from among the plurality of second pixel circuits to the second initialization voltage supply line, and wherein the 2-2th horizontal connection line is configured to electrically connect 2-2th pixel circuits arranged in a second row different from the first row from among the plurality of second pixel circuits to the second anode initialization voltage supply line.

10. The display device of claim 9, wherein the 2-1th horizontal connection line comprises a plurality of 2-1th horizontal connection lines, wherein the 2-2th horizontal connection line comprises a plurality of 2-2th horizontal connection lines, and wherein the plurality of 2-1th horizontal connection lines and the plurality of 2-2th horizontal connection lines are alternately arranged along the column direction.

11. A display device comprising:

a plurality of first light emitting elements and a plurality of first pixel circuits arranged in a first display area and electrically connected to each other;

a plurality of second light emitting elements arranged in a second display area comprising a transmission area and at least partially surrounded by the first display area;

a plurality of second pixel circuits arranged in a third display area between the first display area and the second display area and electrically connected to the plurality of second light emitting elements;

a pad unit disposed in a peripheral area outside the first display area;

a data line disposed in the first display area and extending in a column direction;

a first initialization voltage supply line disposed in the peripheral area and configured to provide a first initialization voltage to the plurality of first pixel circuits;

a second initialization voltage supply line disposed in the peripheral area and configured to provide a second initialization voltage having a different level from the first initialization voltage to the plurality of second pixel circuits;

a first anode initialization voltage supply line disposed in the peripheral area and configured to provide a first anode initialization voltage to the plurality of first pixel circuits;

a second anode initialization voltage supply line disposed in the peripheral area and configured to provide a second anode initialization voltage to the plurality of second pixel circuits; and a connection line-pattern unit comprising a plurality of horizontal connection lines extending in a row direction and a plurality of vertical connection lines extending in the column direction, wherein a first vertical connection line of the plurality of vertical connection lines of the connection line-pattern unit is electrically connected to the pad unit, wherein a first horizontal connection line of the plurality of horizontal connection lines of the connection line-pattern unit is configured to electrically connect the first vertical connection line to the data line, and wherein a second horizontal connection line of the plurality of horizontal connection lines of the connection line-pattern unit is configured to electrically connect the plurality of second pixel circuits to the second anode initialization voltage supply line.

12. The display device of claim 11, wherein the second horizontal connection line is disposed in a first area located at both sides of the second display area along the row direction in the first display area.

13. The display device of claim 11, further comprising a branch line disposed in the third display area and extending in the column direction, wherein the second horizontal connection line comprises a plurality of second horizontal connection lines that are arranged in the column direction and electrically connected to the branch line.

14. The display device of claim 11, further comprising a common voltage supply line disposed in the peripheral area and configured to supply a common power voltage to the plurality of first light emitting elements and the plurality of second light emitting elements, wherein a second vertical connection line of the plurality of vertical connection lines of the connection line-pattern unit is electrically connected to the common voltage supply line.

15. The display device of claim 11, further comprising a common voltage supply line disposed in the peripheral area and configured to supply a common power voltage to the plurality of first light emitting elements and the plurality of second light emitting elements, wherein a third horizontal connection line of the plurality of horizontal connection lines of the connection line-pattern unit is electrically connected to the common voltage supply line.

16. The display device of claim 11, further comprising a driving voltage supply line disposed in the peripheral area and configured to supply a driving power voltage to the plurality of first pixel circuits and the plurality of second pixel circuits, wherein a second vertical connection line of the plurality of vertical connection lines of the connection line-pattern unit is electrically connected to the driving voltage supply line.

17. The display device of claim 11, further comprising a driving voltage supply line disposed in the peripheral area and configured to supply a driving power voltage to the plurality of first pixel circuits and the plurality of second pixel circuits, wherein a third horizontal connection line of the plurality of horizontal connection lines of the connection line-pattern unit is electrically connected to the driving voltage supply line.

18. An electronic apparatus comprising:

a display device comprising a first display area and a second display area having different resolutions from each other, and a third display area between the first display area and the second display area; and an electronic component overlapping a transmission area in the second display area, wherein the display device comprises:

a plurality of first light emitting elements and a plurality of first pixel circuits arranged in the first display area and electrically connected to each other;

a plurality of second light emitting elements arranged in the second display area comprising the transmission area and at least partially surrounded by the first display area;

a plurality of second pixel circuits arranged in the third display area between the first display area and the second display area and electrically connected to the plurality of second light emitting elements;

a pad unit disposed in a peripheral area outside the first display area;

a data line disposed in the first display area and extending in a column direction;

a first initialization voltage supply line disposed in the peripheral area and configured to provide a first initialization voltage to the plurality of first pixel circuits;

a second initialization voltage supply line disposed in the peripheral area and configured to provide a second initialization voltage having a different level from the first initialization voltage to the plurality of second pixel circuits; and a connection line-pattern unit comprising a plurality of horizontal connection lines extending in a row direction and a plurality of vertical connection lines extending in the column direction, wherein a first vertical connection line of the plurality of vertical connection lines of the connection line-pattern unit is electrically connected to the pad unit, wherein a first horizontal connection line of the plurality of horizontal connection lines of the connection line-pattern unit is configured to electrically connect the first vertical connection line to the data line, and wherein a second horizontal connection line of the plurality of horizontal connection lines of the connection line-pattern unit is configured to electrically connect the plurality of second pixel circuits to the second initialization voltage supply line.

19. The electronic apparatus of claim 18, wherein the second horizontal connection line is disposed in a first area located at both sides of the second display area along the row direction in the first display area.

20. The electronic apparatus of claim 18, wherein the display device further comprises a branch line disposed in the third display area and extending in the column direction, and wherein the second horizontal connection line comprises a plurality of second horizontal connection lines that are arranged in the column direction and electrically connected to the branch line.

21. The electronic apparatus of claim 18, wherein the display device further comprises a common voltage supply line in the peripheral area and configured to supply a common power voltage to the plurality of first light emitting elements and the plurality of second light emitting elements, wherein a second vertical connection line of the plurality of vertical connection lines of the connection line-pattern unit is electrically connected to the common voltage supply line, and wherein a third horizontal connection line of the plurality of horizontal connection lines of the connection line-pattern unit is electrically connected to the common voltage supply line.

22. The electronic apparatus of claim 18, wherein the display device further comprises a driving voltage supply line disposed in the peripheral area and configured to supply a driving power voltage to the plurality of first pixel circuits and the plurality of second pixel circuits, wherein a second vertical connection line of the plurality of vertical connection lines of the connection line-pattern unit is electrically connected to the driving voltage supply line, and wherein a third horizontal connection line of the plurality of horizontal connection lines of the connection line-pattern unit is electrically connected to the driving voltage supply line.

23. The electronic apparatus of claim 18, wherein the display device further comprises:

a first anode initialization voltage supply line disposed in the peripheral area and configured to provide a first anode initialization voltage to the plurality of first pixel circuits; and a second anode initialization voltage supply line disposed in the peripheral area and configured to provide a second anode initialization voltage having a different level from the first anode initialization voltage to the plurality of second pixel circuits, wherein the second horizontal connection line of the plurality of horizontal connection lines of the connection line-pattern unit comprises a 2-1th horizontal connection line and a 2-2th horizontal connection line spaced from each other along the column direction, wherein the 2-1th horizontal connection line is configured to electrically connect 2-1th pixel circuits arranged in a first row from among the plurality of second pixel circuits to the second initialization voltage supply line, and wherein the 2-2th horizontal connection line is configured to electrically connect 2-2th pixel circuits arranged in a second row different from the first row from among the plurality of second pixel circuits to the second anode initialization voltage supply line.

* * * * *